United States Patent
Perera et al.

(10) Patent No.: US 10,347,783 B2
(45) Date of Patent: Jul. 9, 2019

(54) TUNABLE HOT-CARRIER PHOTODETECTOR

(71) Applicant: Georgia State University Research Foundation, Inc., Atlanta, GA (US)

(72) Inventors: A. G. Unil Perera, Mableton, GA (US); Yanfeng Lao, Atlanta, GA (US)

(73) Assignee: Georgia State University Research Foundation, Inc., Atlanta, GA (US)

( * ) Notice: Subject to any disclaimer, the term of this patent is extended or adjusted under 35 U.S.C. 154(b) by 0 days.

(21) Appl. No.: 14/914,751

(22) PCT Filed: Aug. 27, 2014

(86) PCT No.: PCT/US2014/052934
§ 371 (c)(1),
(2) Date: Feb. 26, 2016

(87) PCT Pub. No.: WO2015/069367
PCT Pub. Date: May 14, 2015

(65) Prior Publication Data
US 2016/0218237 A1 Jul. 28, 2016

Related U.S. Application Data

(60) Provisional application No. 61/870,297, filed on Aug. 27, 2013, provisional application No. 61/954,035, filed on Mar. 17, 2014.

(51) Int. Cl.
*H01L 31/109* (2006.01)
*H01L 31/107* (2006.01)
(Continued)

(52) U.S. Cl.
CPC .... *H01L 31/1075* (2013.01); *H01L 31/03046* (2013.01); *H01L 31/101* (2013.01); *H01L 31/147* (2013.01)

(58) Field of Classification Search
CPC .......... H01L 31/1075; H01L 31/63046; H01L 31/101; H01L 31/147
(Continued)

(56) References Cited

U.S. PATENT DOCUMENTS

| 4,353,081 A | 10/1982 | Allyn et al. |
| 4,383,269 A | 5/1983 | Capasso |

(Continued)

FOREIGN PATENT DOCUMENTS

WO  2005/106927  11/2005

OTHER PUBLICATIONS

Freitag, et al., "Photoconductivity of biased graphene", Nature Photonics, vol. 7, Jan. 2013, pp. 53-59.
(Continued)

*Primary Examiner* — Kevin M Picardat
(74) *Attorney, Agent, or Firm* — Thomas Horstemeyer, LLP

(57) ABSTRACT

Various examples are provided for hot carrier spectral photodetectors that can be tuned. In one example, among others, a hot-carrier photodetector includes a graded barrier; an absorber disposed on the graded barrier; and a second barrier disposed on the absorber. For example, the absorber can include p-type doped GaAs. The graded barrier is disposed between the absorber and an injector, which can include p-type doped GaAs. In some implementations, the hot-carrier detector can include multiple barriers and absorbers. The hot-carrier photodetector can include an optical source (e.g., a LED) to trigger the VLWIR response in the photodetector.

20 Claims, 19 Drawing Sheets

(51) Int. Cl.
H01L 31/101 (2006.01)
H01L 31/0304 (2006.01)
H01L 31/147 (2006.01)

(58) Field of Classification Search
USPC .................................................. 257/185, 191
See application file for complete search history.

(56) References Cited

U.S. PATENT DOCUMENTS

| | | | |
|---|---|---|---|
| 4,894,526 A | 1/1990 | Bethea et al. | |
| 9,123,622 B2* | 9/2015 | Hoenk | H01L 31/02161 |
| 2004/0046176 A1 | 3/2004 | Kim et al. | |
| 2005/0258415 A1 | 11/2005 | Perera et al. | |
| 2007/0158638 A1 | 7/2007 | Perera et al. | |
| 2011/0049566 A1 | 3/2011 | Perera et al. | |
| 2011/0315958 A1* | 12/2011 | Perera | H01L 31/09 257/14 |
| 2012/0068157 A1* | 3/2012 | Kub | B82Y 10/00 257/15 |

OTHER PUBLICATIONS

Gabor, et al., "Hot Carrier-Assisted Intrinsic Photoresponse in Graphene", Science Magazine, vol. 334, Nov. 4, 2011, pp. 648-652.
Sun, et al., "Infrared Photodetectors Based on CVD-Grown Graphene and PbS Quantum Dots with Ultrahigh Responsivity", Advanced Materials, 2012, 24, 5878-5883.
Yan, et al., "Determination of graphene work function and graphene-insulator-semiconductor band alignment by internal photoemission spectroscopy", Applied Physics Letters 101, 022105, 2012.
Rossi, et al., "Theory of ultrafast phenomena in photoexcited semiconductors", Reviews of Modern Physics, vol. 74, Jul. 2002, The American Physical Society, pp. 895-950.
Winnerl, et al., "Carrier Relaxation in Epitaxial Graphene Photoexcited Near the Dirac Point", Physical Review Letters, Dec. 2, 2011, 107, 237401.
Rosenwaks, et al., "Hot-carrier cooling in GaAs: Quantum wells versus bulk", Physical Review B, vol. 48, No. 19, Nov. 15, 1993, pp. 14 675-14 678.
Hu, et al., "Inelastic scattering in a doped polar semiconductor at finite temperature", Physical Review B, vol. 44, No. 15, Oct. 15, 1991, pp. 8319-8322.
Petersen, et al., "Observation of Hot-Electron Energy Loss through the Emission of Phonon-Plasmon Coupled Modes in GaAs", Physical Review Letters, vol. 65, No. 6, Aug. 6, 1990, pp. 760-763.
Sicault, et al., "Experimental study of hot-electron inelastic scattering rate in p-type InGaAs", Physical Review B, vol. 65, 121301(R), 2002, The American Physical Society.
Xiao, et al., "Carrier multiplication in semiconductor nanocrystals detected by energy transfer to organic dye molecules", Nature Communications, DOI: 10.1038/ncomms2183, Published Nov. 6, 2012, pp. 1-7.
Capasso, "Band-Gap Engineering: From Physics and Materials to New Semiconductor Devices", Science, New Series, vol. 235, No. 4785, Jan. 9, 1987, pp. 172-176.
Kang, et al., "Monolithic germanium/silicon avalanche photodiodes with 340 GHz gain-bandwidth product", Nature Photonics, Letters, vol. 3, Jan. 2009, pp. 59-63.
Lao, et al., "Temperature-dependent internal photoemission probe for band parameters", Physical Review B 86, 195315 (2012), American Physical Society.
Rinzan, et al., "AlGaAs emitter/GaAs barrier terahertz detector with a 2.3 THz threshold", Applied Physics Letters 86, 071112 (2005), American Institute of Physics.
Perera, et al., "GaAs multilayer p+-i homojunction far-infrared detectors", Journal Application Physics, 81, 1997, American Institute of Physics.
Matsik, et al., "Cutoff tailorability of heterojunction terahertz detectors", Applied Physics Letters, vol. 82, No. 1, Jan. 6, 2003, pp. 139-141.
Chapler, et al., "Infrared probe of the insulator-to-metal transition in Ga1-xMnxAs and Ga1-xBexAs", Physical Review B 84, 081203(R) (2011), American Physical Society.
Lao, et al., "Dielectric function model for p-type semiconductor inter-valence band transitions", Journal of Applied Physics 109, 103528 (2011), American Institute of Physics.
Newman, et al., "Effect of Impurities on Free-Hole Infrared Absorption in p-Type Germanium", Physical Review, vol. 105, No. 3, Feb. 1, 1957, pp. 885-886.
Levi, et al., "Hot-Electron Spectroscopy of GaAs", Physical Review Letters, vol. 54, No. 14, Apr. 8, 1985, pp. 1570-1572.
Levi, et al., "Injected-Hot-Electron Transport in GaAs", Physical Review Letters, vol. 55, No. 19, Nov. 4, 1985, The American Physical Society, pp. 2071-2073.
Thibaudeau, et al., "A self-consistent model for quantum well infrared photodetectors", Journal Application Physics 79 (1), Jan. 1, 1996, American Institute of Physics, pp. 446-454.
Woerner, et al., "Relaxation processes of hot holes in p-type germanium studied by picosecond infrared spectroscopy", Physical Review B, vol. 45, No. 15, Apr. 15, 1992, The American Physical Society, pp. 8378-8387.
Elsaesser, et al., "Relaxation processes of hot holes in Ge and GaAs investigated by ultrafast infrared spectroscopy", Semicond, Sci, Technol, 9 (1994) pp. 689-693.
Esaev, et al. "Design and optimization of GaAs/AlGaAs heterojunction infrared detectors", Journal of Applied Physics, vol. 96, No. 8, Oct. 15, 2004, American Institute of Physics, pp. 4588-4597.
Brill, et al., "Electron heating in GaAs due to electron-electron interactions", Physical Review B, Bolume 49, No. 20, May 15, 1994, The American Physical Society, pp. 14 762-14 765.
Blakemore, "Semiconducting and other major properties of gallium arsenide", Journal Application Physics 53(10), Oct. 1982, American Institute of Physics, pp. R123-R181.
Matthews, et al., "Transient photoconductivity measurements of carrier lifetimes in an InAs/In0.15Ga0.85As dots-in-a-well detector", Applied Physics Letters 90, 103519 (2007), American Institute of Physics.
Chen, et al., "Hybrid Organic/Inorganic Optical Up-Converter for Pixel-Less Near-Infrared Imaging", Advanced Materials, 2012, 24, 3138-3142.
Sang, et al., "Arbitrary Multicolor Photodetection by Hetero-integrated Semiconductor Nanostructures", Scientific Reports, 3:2368, DOI: 10.1038/srep02368, pp. 1-8.
Perera, et al., "Heterojunction wavelength-tailorable far-infrared photodetectors with response out to 70um", Applied Physics Letters, vol. 78, No. 15, Apr. 9, 2001, American Institute of Physics, pp. 2241-2243.
Perera, et al., "High operating temperature split-off band infrared detectors", Applied Physics Letters 89, 131118 (2006), American Institute of Physics.
Lao, et al., "Light-hole and heavy-hole transitions for high-temperature long-wavelength infrared detection", Applied Physics Letters 97, 091104 (2010), American Institute of Physics.
International Search Report for PCT/US2014/052934 dated May 1, 2015.
Lao et al.; InAs/GaAs p-type quantum dot infrared photodetector with higher efficiency; Applied 1-16 Physics Letters; vol. 103, 2411-15 (2013) Publish~d online (Dec. 20, 2013).
Lao et al.; Tunable hot-carrierphotodetection beyond the band-gap spectral limit; Nature 1-16 Photonics; vol. 8 pp. 412-418 (2014) Published online (Apr. 13, 2014).
Lao, et al., "Tunable hot-carrier photodetection beyond the bandgap spectral limit", Nature Photonics, vol. 8, May 2014, pp. 412-418.
Perera, "Hot-hole photodetectors" Nature Photonics, vol. 8, May 2014, p. 420.
Supplemental Search Report for EP Application No. 14859482.3, dated Apr. 11, 2017.
Ryzhii, V., and M. Ershov.,"Infrared multiple-quantum-well phototransistor." Solid-state electronics 38.1 (1995): 149-155.

(56) References Cited

OTHER PUBLICATIONS

Perera, A. G. U., et al. "Hot-carrier photodetector beyond spectral limit." Photonics Conference (IPC), 2013 IEEE. IEEE, 2013.
First Examination Report for AU Application No. 2014347256, dated Feb. 26, 2018.
Response to First Examination Report for AU Application No. 2014347256 filed Jun. 5, 2018.
Response to Supplemental Search Report for EP Application No. 14859482.3-1504 filed Nov. 10, 2017.
Second Examination Report for AU Application No. 2014347256, dated Jun. 7, 2018.

* cited by examiner

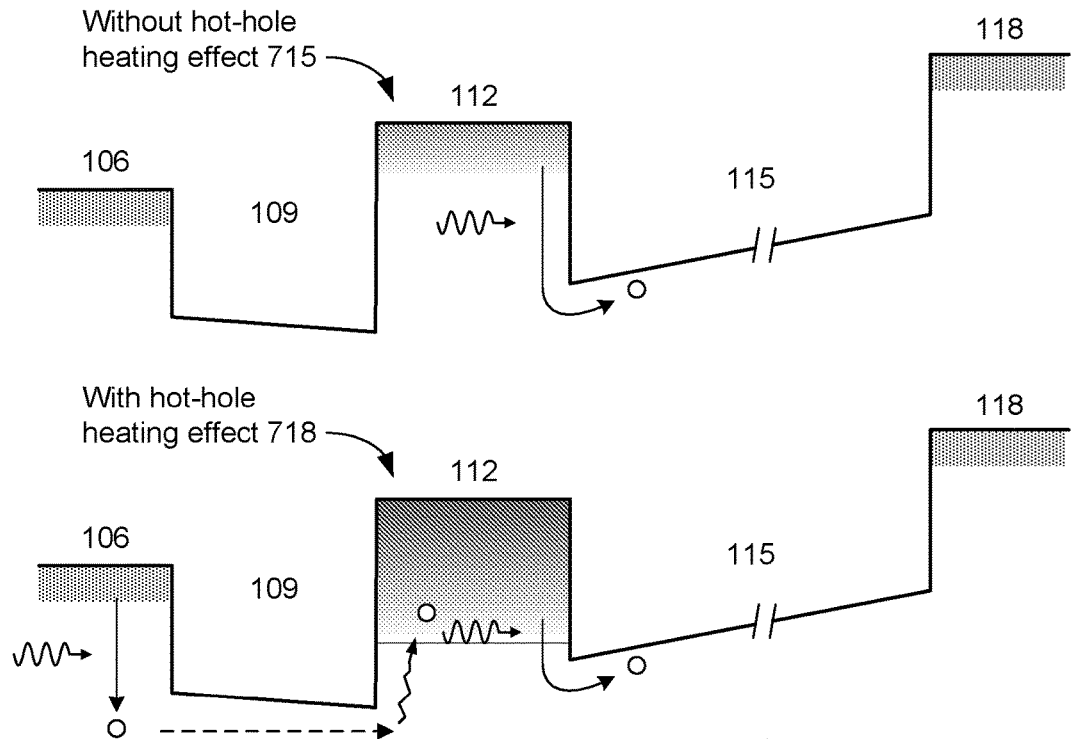
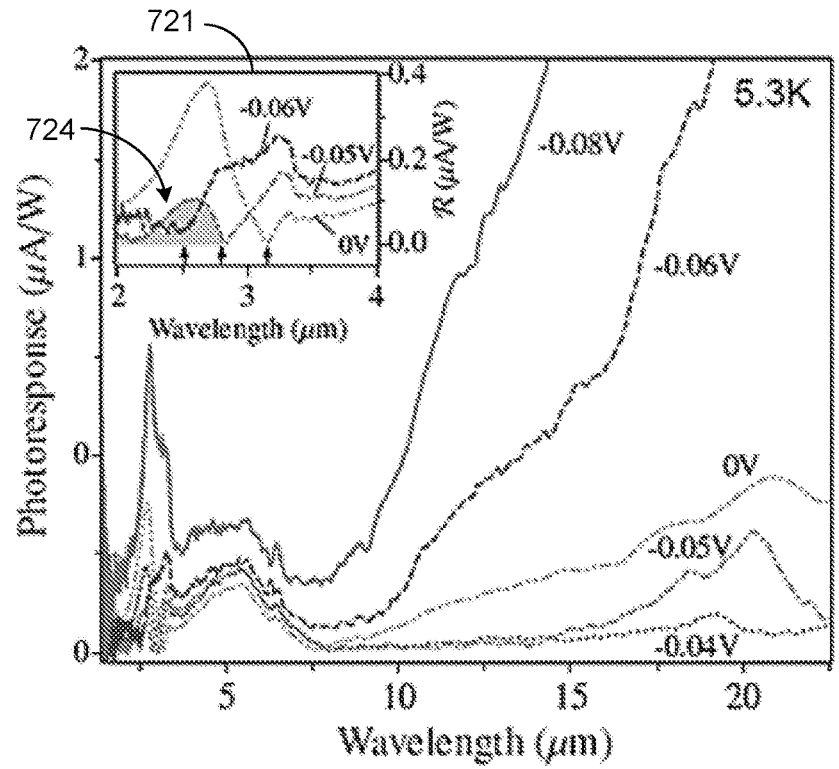
FIG. 7B
FIG. 7C

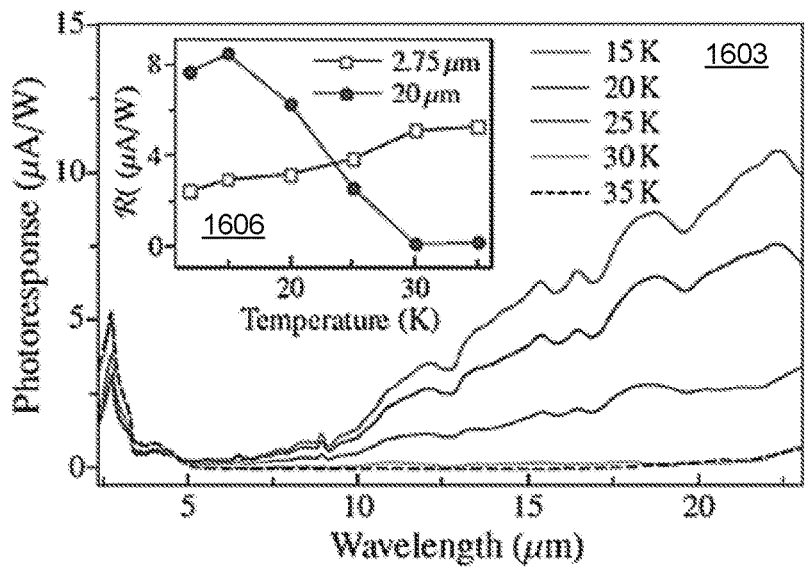
FIG. 16E
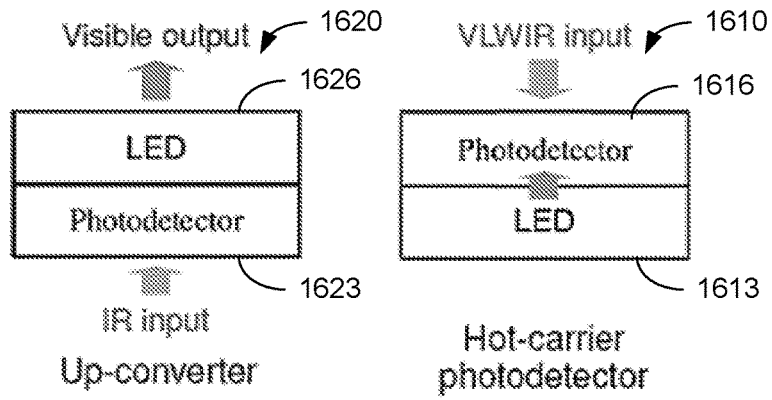
FIG. 16F
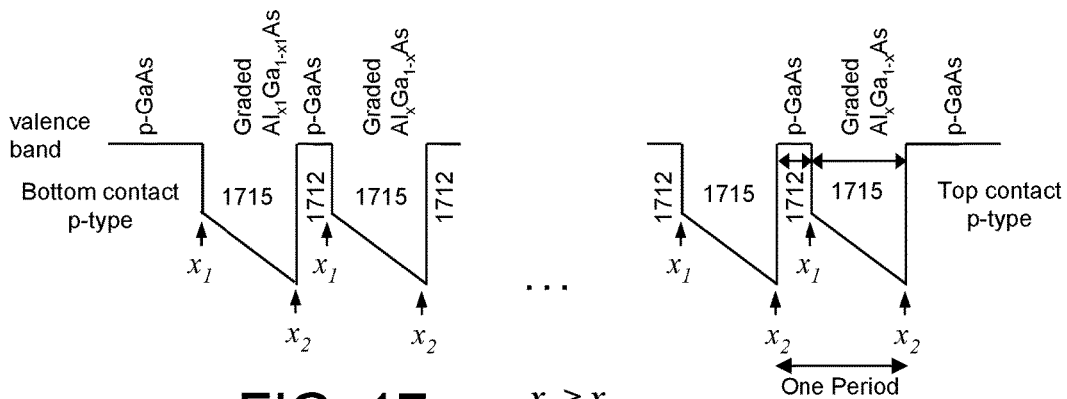
FIG. 17      $x_2 > x_1$

TUNABLE HOT-CARRIER PHOTODETECTOR

CROSS REFERENCE TO RELATED APPLICATIONS

This application is the 35 U.S.C. § 371 national stage application of PCT Application No. PCT/US2014/052934, filed Aug. 27, 2014, which claims priority to, and the benefit of, U.S. provisional applications entitled "TUNABLE HOT-CARRIER PHOTODETECTOR" having Ser. No. 61/870,297, filed Aug. 27, 2013, and having Ser. No. 61/954,035, filed Mar. 17, 2014, all of which are hereby incorporated by reference in their entirety.

STATEMENT REGARDING FEDERALLY SPONSORED RESEARCH OR DEVELOPMENT

This invention was made with government support under agreement W911NF-12-2-0035 awarded by the U.S. Army Research Office and agreement ECCS-1232184 awarded by the U.S. National Science Foundation. The Government has certain rights in the invention.

BACKGROUND

The detection of infrared radiation is important in a wide range of applications in the civilian, industrial, medical, astronomical and military sectors. Infrared radiation can be detected by photon detectors and thermal detectors. Photodetectors such as homojunction interfacial workfunction internal photoemission (HIWIP) detectors, heterojunction interfacial workfunction internal photoemission (HEIWIP) detectors, and quantum well infrared photodetectors (QWIP) can detect radiation in the middle infrared (MIR) and far infrared (FIR) ranges. In general, the wavelength ($\lambda$) range for the MIR is about 5 to 30 µm and for the FIR is greater than about 30 µm.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 7C is a plot of photoresponse of a detector sample as different bias levels in accordance with various embodiments of the present disclosure.

FIGS. 7B and 7D are examples of a VB diagram of a photodetector under different operating conditions in accordance with various embodiments of the present disclosure.

FIG. 16E is a plot illustrating examples of photoresponse at different temperatures in accordance with various embodiments of the present disclosure.

FIG. 16F includes graphical representations of a hot-carrier photodetector and an up-converter in accordance with various embodiments of the present disclosure.

FIG. 17 is a VB diagram of a hot-carrier photodetector including multiple periods in accordance with various embodiments of the present disclosure.

DETAILED DESCRIPTION

Figure 1A:
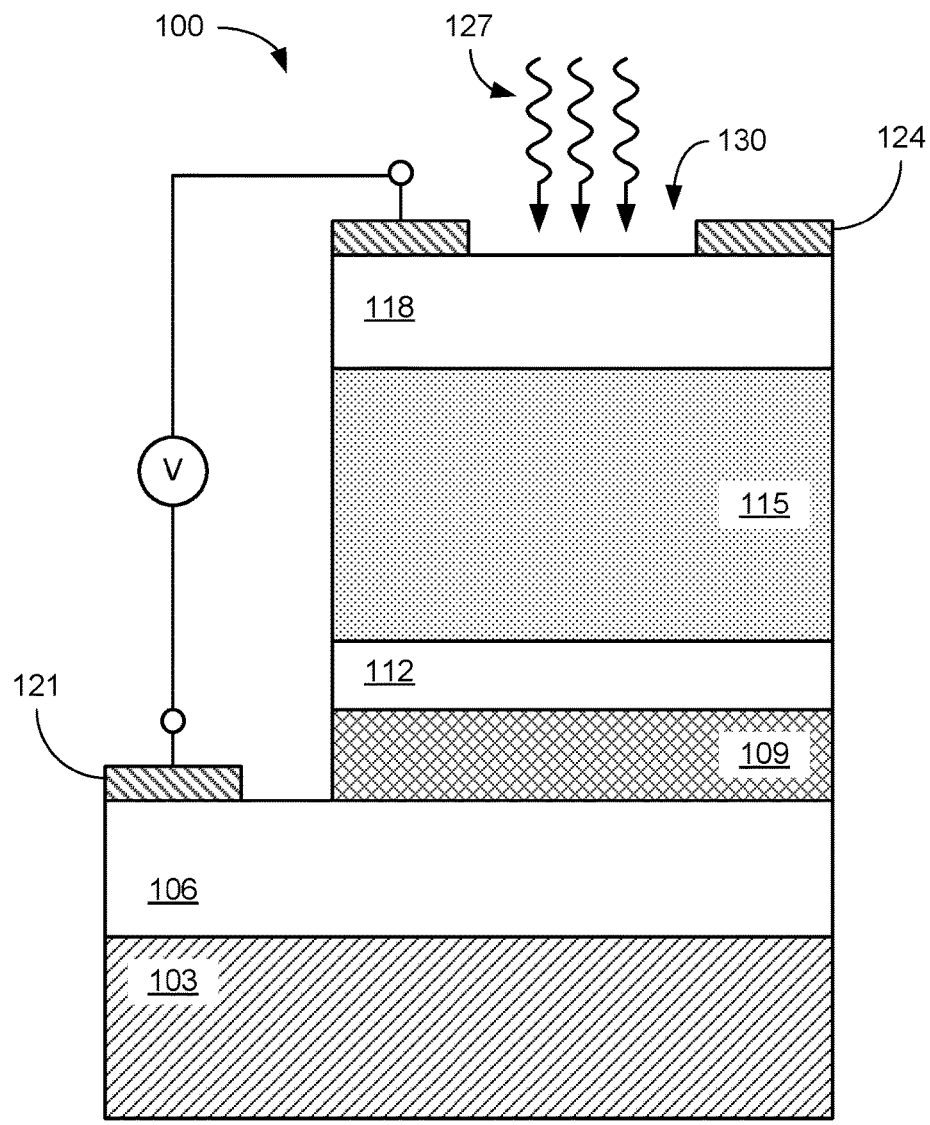
FIGS. 1A and 1B are graphical representations of an example of a hot-carrier photodetector in accordance with various embodiments of the present disclosure.

Disclosed herein are various examples related to tunable hot carrier spectral photodetectors. Reference will now be made in detail to the description of the embodiments as illustrated in the drawings, wherein like reference numbers indicate like parts throughout the several views.

Photovoltaic detectors are attractive for achieving (i) extremely low noise, (ii) high impedance and (iii) low power dissipation, compared to photoconductive detectors. The wavelength limit ($\lambda_c$) for detection in a conventional photodetector is limited to a characteristic energy ($\Delta$) through the relationship: $\lambda_c=hc/\Delta$, where $\Delta$ also determines the detector noise, dark current and hence its performance, including its maximum operating temperature. This can impose significant constraints on the design of photodetectors. For example, a long-wavelength response corresponds to a reduced value of $\Delta$. Spectral extension of the photodetection limit using a hot-hole energy transfer mechanism, without altering the values of $\Delta$, is disclosed. Hot holes, optically or electrically injected into the absorption region of the photodetector, excite cold holes to higher-energy states, and a thermalized equilibrium is established between the hot and cold holes. The thermalized holes are then capable of detecting incident photons in the very long-wavelength infrared range, contributing to the photocurrent. The cold holes are therefore excited into higher energy states, and capable of responding to a longer-wavelength infrared radiation than would be possible without the hot-hole injection. A photodetector with $\Delta=0.32$ eV (i.e., $\lambda=3.9$ μm) that responds up to 100 μm is demonstrated. The photodetector can be tuned by varying the degree of hot-hole injection. For example, $\lambda_c$ and $\Delta$ can be individually adjusted in order to achieve targeted wavelengths for detection while simultaneously minimizing the detector noise and dark current. In this way, operation of a conventional photodetector can be extended beyond its spectral limit. It also provides other possibilities for the design of energy-efficient devices by using hot carriers for photon absorption rather than heating the material. The hot carriers divert their energy to cold carriers rather than heating up the lattice, which can improve the energy efficiency of the device.

Hot-carrier driven effects or dynamics can be used for photodetection. Hot carriers, injected electrically or optically, relax typically through interactions with lattice vibrations, cold carriers and impurities of the device. Of these, inelastic scattering with the lattice constitutes a major cooling path, predominantly accompanied by the emission of optical phonons. In general, the excess energy of the hot carriers transferred to the lattice converts into heat, which degrades the energy efficiency of devices. However, with sufficiently high energy, e.g., in excess of a threshold, as the hot carriers impart their energy to the lattice, they can initiate carrier multiplication processes, which enhance the optical gain and can be used for devices such as avalanche photodiodes. Hot carrier effects can also be applied to photodetection. For photodetection, the principle is based on the movement of hot carriers under a built-in electric field, or a hot-carrier induced temperature variation which either gives rise to a thermoelectric current or alters the resistance of the device.

Cold carriers can exist in materials through doping in, e.g., III-V semiconductors. Hot carriers will interact with such cold carriers, giving up their excess energy, which results in impact ionization if a sufficiently high energy carrier is injected. Within a fast time scale, they may redistribute their energy and momentum with cold carriers through carrier-carrier scattering. This process can proceed through the absorption of phonons (emitted from the hot carriers) by the cold carriers, or cold carriers directly interacting with hot carriers through the Coulomb interaction, leading to a redistribution of the total energy with a new thermal equilibrium being attained between the hot and cold carriers. This can result in a change in the absorption characteristics of infrared radiation, with operational performance being dependent on the injection of hot carriers. A significant difference between this hot-cold interaction and a hot-carrier driven effect is that the cold carriers, before and after heating, can reside in the same material of a heterostructure. Therefore, conventional band-structure engineering technology can be applied favorably to tailor the performance of devices.

The hot-hole induced heating effects can be used to overcome the conventional spectral limit of detectors, which is set by the "$\lambda_c=hc/\Delta$" rule, where $\lambda_c$ is the maximum wavelength limit of detection and $\Delta$ is a characteristic energy describing optical transitions during operation. In one implementation, a very long-wavelength infrared (VLWIR) response (of up to 100 μm) was observed in a photodetector with $\Delta=0.32$ eV (or $\lambda=3.9$ μm). This improvement in the VLWIR response may have resulted from the heating of the cold holes in the detector absorber by the injected hot holes, which may have enabled the absorption of infrared radiation with a considerably longer wavelength than would be possible without the hot-hole injection. Thus, the "$\lambda_c=hc/\Delta$" rule can be surpassed by using hot-hole injection. Consequently, $\lambda_c$ and/or $\Delta$ can be designed to optimize the detection of a desired wavelength while minimizing the detector noise and dark current. Moreover, because the hot carriers divert their energy to cold carriers rather than heating up the lattice and degrading the device performance, the hot-carrier induced mechanism can provide an efficient method to realize energy-efficient devices.

The use of semiconductor heterostructures is a convenient means for injecting hot carriers into devices. A heterojunction is formed by two different electrical types of two chemically different materials with each material having a band gap different from that of the other. An example of a heterojunction is a $GaAs/Al_{(x)}Ga_{(1-x)}As$ junction, where x is a number satisfying $0<x<1$. Carriers surmounting a high-band gap barrier and entering into a low-band gap material become "hot" because of their excess energy relative to the band edge. Cold carriers, on the other hand, can be obtained by simply doping the low-band gap material.

Figure 1B:
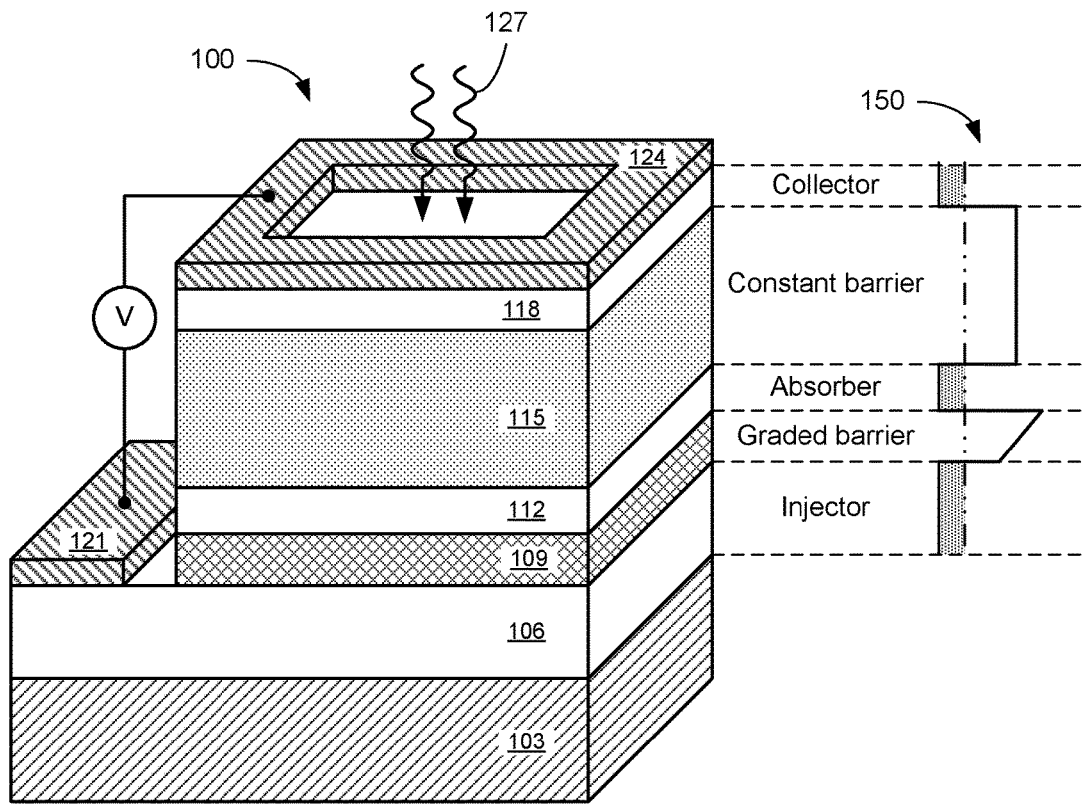

Referring to FIGS. 1A and 1B, shown are graphical representations of a photodetector 100. In the example of FIG. 1A, the photodetector 100 includes a substrate 103, an injector 106, a graded barrier 109, an absorber 112, a constant barrier 115, and a collector 118. Conductive contacts 121 and 124 located at the injector 106 and collector 118, respectively, can be utilized for measuring the response of the photodetector 100 to the incoming optical signals 127. The conductive contact 124 at the collector 118 includes an opening 130 to allow the incoming optical signals 127 to reach the collector 118. FIGS. 1A and 1B illustrate the structure of the photodetector 100.

In one embodiment, among others, the photodetector 100 includes three p-type doped (e.g., $1 \times 10^{19}$ cm$^{-3}$) GaAs regions as the injector 106 with a thickness of about 700 nm, the absorber 112 with a thickness of about 20 nm to about 80 nm and the collector 118 with a thickness of about 100 nm. The injector 106 and absorber 112 are separated by the graded barrier 109 (e.g., Al$_{(x)}$Ga$_{(1-x)}$As with a thickness of about 80 nm) and the absorber 112 and collector 118 are separated by the constant barrier 115 (e.g., AlGaAs with a thickness of about 400 nm). A highly doped and thick (e.g., 80 nm) absorber 112 contains three-dimensional, rather than quantized, energy states. The substrate 103 may be made from a compatible semi-insulating material (e.g., GaAs), which may be either undoped or doped. The conductive contacts 121 and 124 may include, e.g., titanium (Ti), platinum (Pt) and/or gold (Au).

Figure 2:
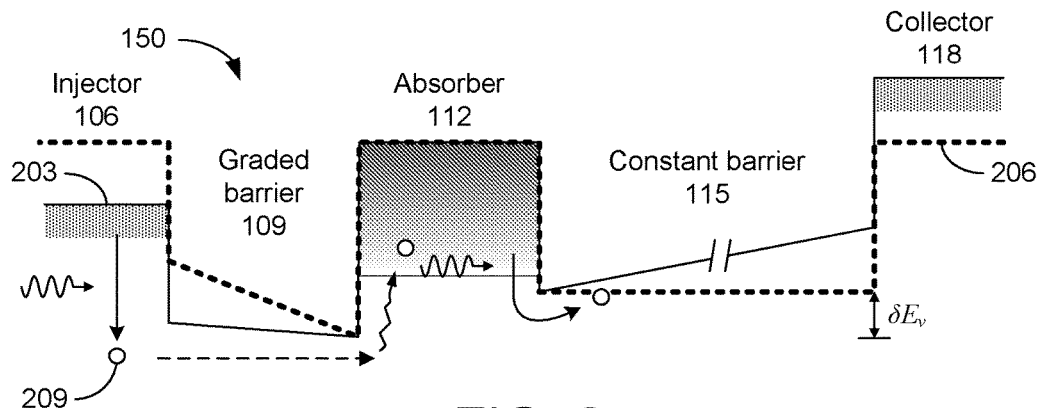
FIG. 2 is an example of a valence band (VB) diagram of the hot-carrier photodetector of FIGS. 1A and 1B in accordance with various embodiments of the present disclosure.

The alignment of the valence-band (VB) diagram 150 with respect to the photodetector 100 is illustrated in FIG. 1B. FIG. 2 depicts the VB diagram 150 with more detail. The thicker dashed line 203 corresponds to equilibrium conditions and the thinner solid line 206 corresponds to reverse bias conditions. The absorber 112 is p-type doped and sandwiched between two AlGaAs potential barriers 115 and 109 above and below the absorber (emitter) 112, one of which is linearly graded up to a point higher than another giving rise to a barrier offset $\delta E_v$. The p-type doping provides free holes which are responsible for photon absorption through intra- and inter-valence band transitions. A reverse bias such as, e.g., a positive polarity on the injector 106 is applied to the device 100 to drive photoexcited hot holes 209 from the injector 106 towards the collector 118.

Upon absorbing incident photons, holes photoexcited in the injector 106 and absorber 112 move toward the collector 118 due to the applied reverse bias (i.e., positive polarity on the injector 106 and negative polarity on the collector 118). Holes in the injector surmounting the graded barrier and entering into the absorber become "hot" because of their excess energy relative to the valence-band edge of the emitter. When the hot holes 209 pass through the absorber region 112, scattering with cold holes occurs resulting in cooling of the hot holes 209, which transfers excess energy to cold holes. This results in a change in the energy distribution of cold holes, with a population of cold carriers moving into higher energy states. The offset between the two AlGaAs barriers 109 and 115 above and below the absorber 112 facilitates the transport of hot holes 209 under reverse bias. It should be noted that this hot-carrier cooling mechanism in a bulk material is similar to its quantum-well counterpart. However, the use of bulk GaAs/AlGaAs heterostructures allows the photoresponse to be understood without needing to take into account optical transitions between many nearby energy bands in the quantum-well case.

Figure 3:
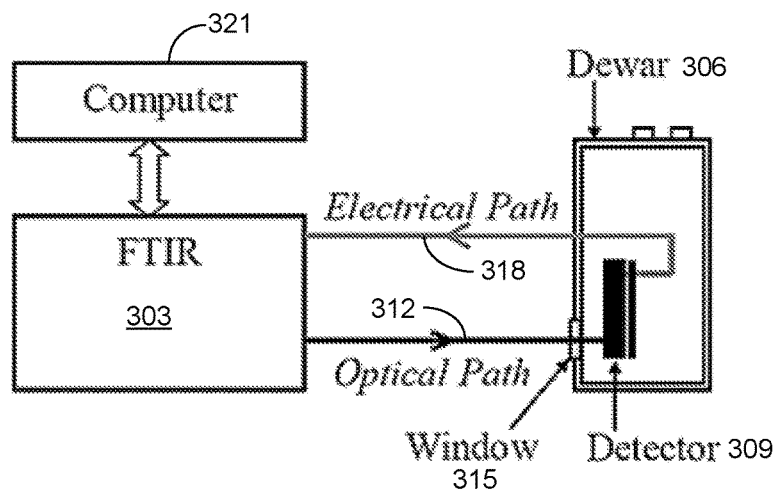
FIG. 3 is a block diagram of an example of an experimental setup for testing detector samples in accordance with various embodiments of the present disclosure.

Referring to FIG. 3, shown is a block diagram of an example of an experimental setup for infrared (IR) spectral measurements using, e.g., a System 2000 Fourier transform infrared (FTIR) spectrometer 303. A dewar 306 includes the detector 309 under test and a temperature controller to allow measurements at different temperatures. An optical path 312 passes from the FTIR spectrometer 303 to the detector 309 via a window 315. An electrical path 318 provides signals from the detector 309 back to the FTIR spectrometer 3030. A computer 321 or other appropriate device may be used to record the test data. The dewar 306 may also include a reference device for comparison with the detector 309 under test.

During testing, the spectral response of the detector 309 under test and a Si composite bolometer, with a known sensitivity, were measured. The two spectra for the device 309 and the bolometer were obtained concurrently with the same combination of optical windows, beam splitters, and filters, so that the optical path was identical. The device spectrum ($I_d$) was then divided by the bolometer spectrum ($I_b$) and multiplied by the bolometer sensitivity ($S_0$) to obtain the voltage responsivity of the device 309 under test:

$$R(V/W) = GI_d S_0/I_b \qquad \text{EQN. 1}$$

Here G is a geometrical factor which corrects for differences in the radiation-incident area of the detector and the bolometer. To obtain the current responsivity, the voltage responsivity is divided by the effective resistance. As the detector and the load resistor act as a voltage divider the effective resistance $R_e$ is the parallel resistance of the load $R_l$ and the detector dynamic resistance $R_d = dV/dI$, yielding $R_e = R_l R_d/(R_l + R_d)$. The final current responsivity is given by:

$$R(A/W) = GI_d S_0 (R_l + R_d)/(R_l R_d I_b) \qquad \text{EQN. 2}$$

Figure 4A:
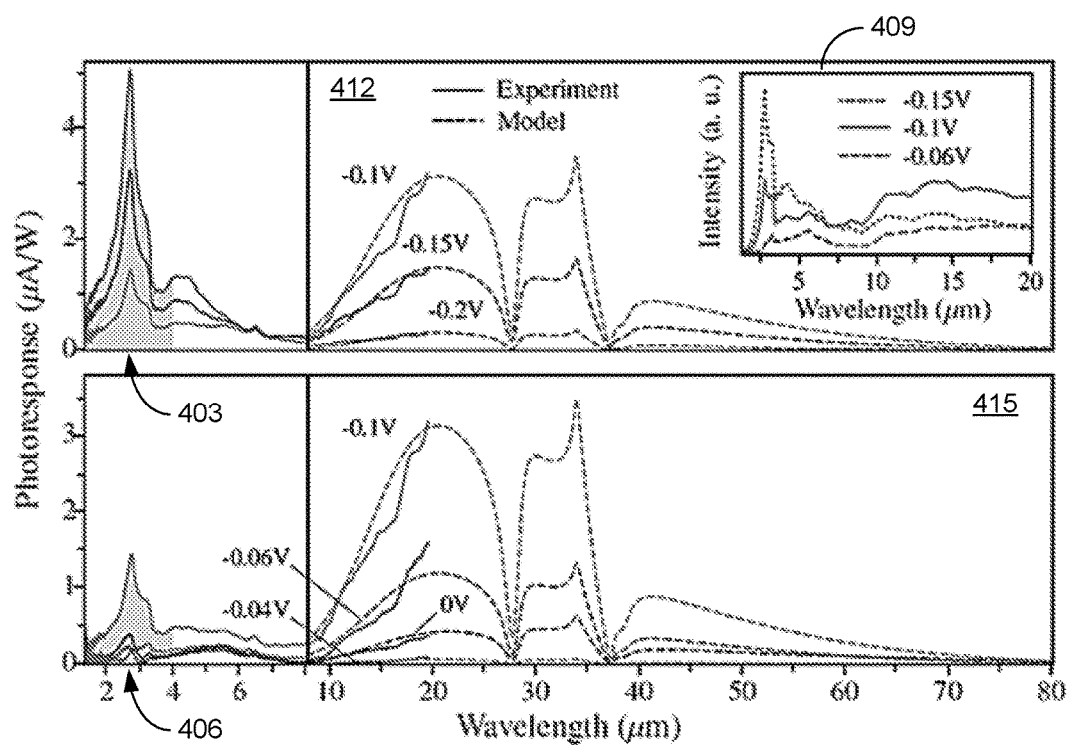
FIGS. 4A and 4B include plots of examples of photoresponse of a detector sample of FIGS. 1A and 1B at different reverse bias levels in accordance with various embodiments of the present disclosure.

Referring to FIG. 4A, shown are plots of examples of the photoresponse (in µA/W) at different reverse bias levels. To understand the effects of hot holes, the photoresponse of a detector sample was measured at 5.3K in order to suppress thermal broadening effects. With reference to FIGS. 1A and 1B, the active region of the detector sample SP1007 included (from top to bottom) a 400 nm-thick undoped Al$_{0.57}$Ga$_{0.43}$As constant barrier 118, a p-type 80 nm-thick GaAs absorber 112 (p=$1 \times 10^{19}$ cm$^{-3}$), and an 80 nm-thick Al$_x$Ga$_{1-x}$As graded barrier 109 with x linearly varying from 0.75 (top) to 0.45 (bottom). The active region is sandwiched between two p-type GaAs ohmic contact layers 121 and 124 (p=$1 \times 10^{19}$ cm$^{-3}$). A p-type 700 nm-thick GaAs layer below the graded barrier 109 forms the injector 106. The characteristic energy ($\Delta$) is associated with the p-type GaAs/Al$_x$Ga$_{1-x}$As junction, defined as the energy difference between the Fermi level of p-type GaAs and Al$_x$Ga$_{1-x}$As barrier (valence-band edge). It was calculated to be 0.25 eV, 0.32 eV and 0.42 eV for the barriers with Al fractions of 0.45, 0.57 and 0.75, respectively, by taking into account band offsets at the heterointerface and doping-induced band gap narrowing. Detectors were processed by wet etching to produce square mesas ranging from 400×400 µm$^2$ to 1000× 1000 µm$^2$, followed by Ti/Pt/Au ohmic contacts being evaporated onto the top and bottom p-type GaAs contact layers (collector 118 and injector 106). A top ring contact 124 with a window opened in the center was fabricated to allow for front-side illumination.

FIG. 4A shows the spectral responsivity of the detector sample SP1007, which has an 80 nm-thick absorber 112 (FIGS. 1A and 1B). The shaded regions (403 and 406) indicate the spectral regions of photoresponse according to $\lambda_c = hc/\Delta$. As can be seen in FIG. 4A, there is a response beyond the wavelength limit of detection determined by $\lambda_c = hc/\Delta$ (3.9 µm). This is also shown in the original spectra directly measured by a Fourier transform infrared (FTIR) spectrometer (without calibration of the bolometer), as plotted in the inset panel 409. The VLWIR response in panels 412 and 415 is bias dependent with a maximum occurring at −0.1V, with a zero-response threshold wavelength estimated to be about 100 µm based on the escape-cone model simulations (plotted as dashed lines in panels 412 and 415).

Carrier emission across the emitter/barrier heterointerface is typically described as an internal photoemission process, the emission probability of which can be evaluated by an escape-cone model. The basic idea is to calculate the number of carriers which are capable of escaping over the potential barrier by having the normal (to the interface) momentum greater than that of the barrier. These carriers occupy energy states on a spherical Fermi cap in the k space. This model can be used to extract the threshold energy of photoemission, and also used to simulate the spectral response of heterojunction photodetectors. For example, Rinzan et al. ("Quantum mechanical effects in internal photoemission THz detectors," *Infrared Physics & Technology*, vol. 50, no. 2-3, pp. 199-205, 2007) presents the escape-cone model for doped heterostructures. To calculate the spectral response, the total quantum efficiency should be evaluated, which essentially divides into two parts: escape efficiency (probability) and absorption efficiency. Absorption efficiency includes two absorption mechanisms for p-type GaAs, which is the absorber 112 (FIGS. 1A and 1B) of the detector samples, i.e., intra- and inter-valence-band optical transitions. According to calculations, the use of the intra-valence-band transition produces a good fit with the experimental photoresponse in the VLWIR range (FIG. 4A). This may be due to that inter-valence-band transitions being mostly dominate in the wavelength range less than 10 µm.

The escape-cone model is typically good for simulating the spectral response of doped heterojunction detectors, where carriers are in the equilibrium distribution with the concentration determined by the doping density. Since an escape-cone model predicts the spectral response reasonably well, it was used to predict the long-wavelength threshold. As shown in panels 412 and 415 of FIG. 4A, the experimental response between 10 µm-22 µm appears as the short-wavelength portion of the calculated response peak. This model is based on an assumption of thermalized holes, depicted by a hole quasi-Fermi level which has a higher energy (deeper into the VB) than the original level (given by the temperature of holes being the same as the lattice). Without full knowledge of this thermalized equilibrium, however, the model represents a coarse simulation of the response. Reasonably good simulation of the VLWIR response using the escape-cone model (FIG. 4A) implies that the distribution of thermalized cold holes is in the equilibrium. This conclusion is consistent with the study of hot-electron spectroscopy. The thermalized hole distribution can be characterized by the Fermi-Dirac distribution function using a quasi-Fermi level and hole temperature (higher than that of the lattice). Nevertheless, the escape-cone model indicates that the VLWIR response has a threshold wavelength of about 100 µm.

Even without a direct measurement of the threshold wavelength, the observation of a response between 4 µm-22 µm is not expected as it differs markedly from $\lambda_c = hc/\Delta$, which predicts a response up to 3.9 µm based on a value of $\Delta = 0.32$ eV (with reverse-bias operation). This is shown as the shaded regions 403 and 406 of FIG. 4A, which occupy only a small portion of the spectrum. Here, $\Delta$ is calculated as the energy difference between the Fermi level of the absorber 112 (related to the cold-hole concentration) and the potential barrier. The agreement of $\lambda_x$ with the experimental response limit is typically found to be good in internal-photoemission (IPE) heterojunction detectors, and is also used as a guideline for designing detectors; for example, an AlGaAs/GaAs THz detector, which requires $\Delta < 0.017$ eV. Furthermore, such a $\lambda_c$-$\Delta$ relationship has also been successfully applied to determining the band offsets at heterojunction interfaces. However, there is clearly no such agreement in the present case, which manifests itself as a new response in the VLWIR range.

Figure 4B:
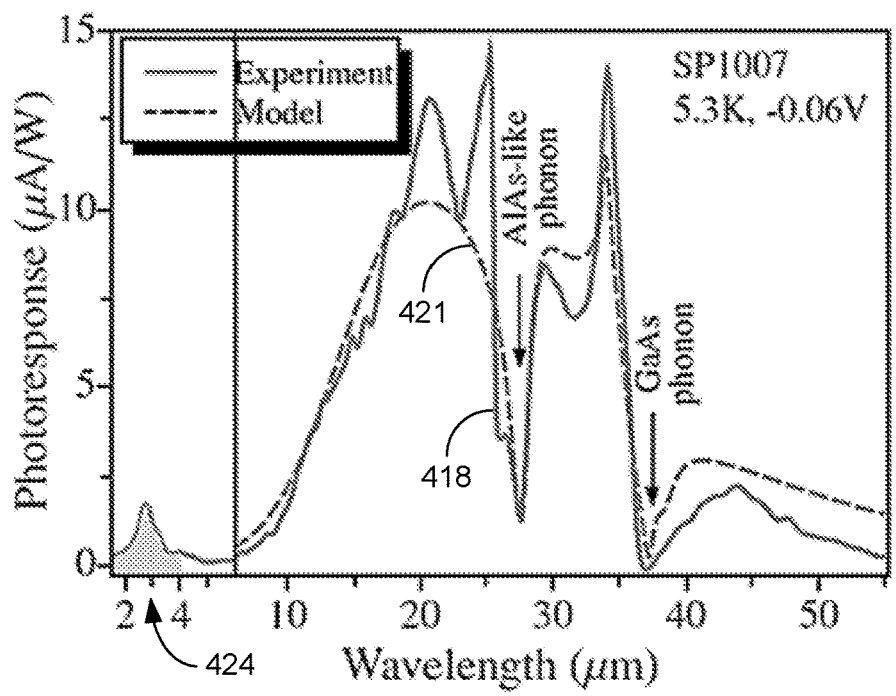

Referring to FIG. 4B, shown is a graph comparing the photoresponse 418 of the detector sample SP1007 measured at 5.3K to an escape-cone model 421. A very long-wavelength infrared (VLWIR) response is seen up to 55 µm, while the standard detection limit is only 3.9 µm (shaded region 424) according to the internal work function (or photoemission threshold, $\Delta$) of the absorber/constant barrier junction ($\Delta = 0.32$ eV). The marked features are associated with the GaAs and AlAs-like phonons. The agreement between $\lambda_c$ and $\Delta$ in terms of $\lambda_c = hc/\Delta$ is typically found to be good in a variety of detectors, and has been used as a guideline to tune spectral response through varying $\Delta$, and to determine band offsets. However, there is clearly no agreement for the observed VLWIR response in this case.

Another striking feature of FIG. 4A is that the VLWIR response varies non-monotonically with increasing bias voltages. The VLWIR response reaches maximums at −0.1V. To clarify this feature, the spectral weight of the photoresponse (which is proportional to the photocurrent ($I_{ph}$)) was calculated and plotted as a function of bias as shown in FIG. 4A. It is defined as:

$$I_{ph} = \int_{\lambda_{min}}^{\lambda_{max}} R(\lambda) \cdot P(\lambda) d\lambda \propto \int_{\lambda_{min}}^{\lambda_{max}} R(\lambda) d\lambda \qquad \text{EQN. 3}$$

where $R(\lambda)$ is the spectral responsivity and $P(\lambda)$ is the power spectrum of the light source. $P(\lambda)$ can be taken as a constant since $R(\lambda)$ is calibrated by a silicon (Si) composite bolometer. By choosing $\lambda_{min}$ and $\lambda_{max}$, a specific photon energy range can be selected.

The broad spectral response can be measured using a broad-band light source in the FTIR spectrometer. The power spectrum of the light source can be divided into two parts: pump and probe. The pump source is designated as the part with high-energy photons which populate holes up to states above all of the barriers, and also gives rise to the response at the short-wavelength end of the spectrum (shaded regions 403 and 406 of FIG. 4A). The probe source is the remaining part responsible for the VLWIR response. A three-dimensional drift model can be used to describe the pump-induced photocurrent, which may be expressed by:

$$I_{ph}^{pump} = e \int_{\Delta}^{+\infty} N(\epsilon) v(\epsilon, F) d\epsilon \qquad \text{EQN. 4}$$

where $N(\epsilon)$ is the energy-dependent hole concentration, $v(\epsilon, F)$ is the drift velocity, and $F$ is the electric field. Taking the derivative of $I_{ph}^{pump}$ with respect to $F$ gives:

$$\frac{dI_{ph}^{pump}}{dF} = e \int_{\Delta}^{+\infty} N(e) \frac{dv(\epsilon, F)}{dF} d\epsilon - e \frac{d\Delta}{dF} \cdot N(\Delta) v(\Delta, F) \qquad \text{EQN. 5}$$

where $d\Delta/dF$ is always negative because of bias-caused barrier lowering (image-force lowering or tilting of the graded barrier 109 of FIG. 2). The energy distribution of holes as a function of the electric field is thus proportional to differentiated $I_{ph}^{pump}$. Particularly, in the high-field region (>5 kV/cm), the first term of EQN. 5 vanishes since $v_{ph}$ approaches the saturation velocity; therefore, $$\frac{dI_{ph}^{pump}}{dF} \propto N(\Delta) \qquad \text{EQN. 6}$$

To identify hot-cold hole interactions, the calculation of differentiated photocurrent was first applied to the spectral weights of the photoresponse. This was then confirmed by measuring photocurrents using laser diodes as excitation optical sources.

Figure 5:
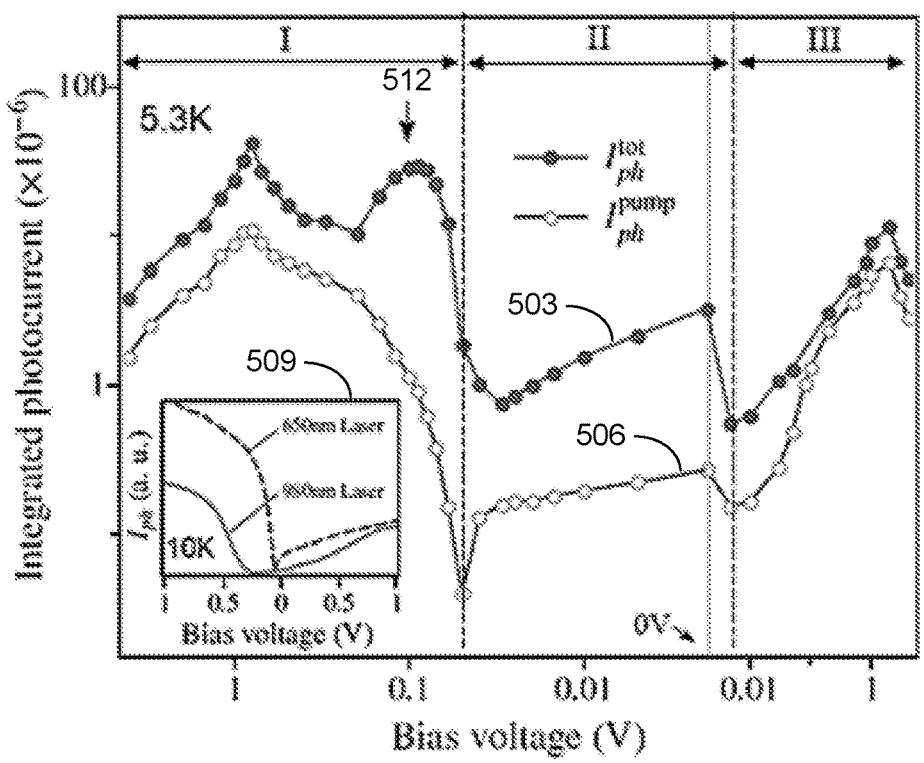
FIG. 5 is a plot of examples of calculated bias-dependent integrated photocurrents of a detector sample in accordance with various embodiments of the present disclosure.

Referring to FIG. 5, shown is a plot of the calculated bias-dependent integrated photocurrents (EQN. 4), defined as the spectral weight of the photoresponse. $I_{ph}^{pump}$ (curve 503) is the photocurrent corresponding to all holes passing through the sample and being collected and $I_{ph}^{tot}$ (curve 506) is the photocurrent corresponding to the holes passing through the sample that are capable of surmounting the highest potential barrier (e.g., 0.42 eV). As shown in FIG. 5, $I_{ph}^{pump}$ 503 represents those holes with energies higher than all of the barriers, while $I_{ph}^{tot}$ 506 is the total photocurrent calculated by choosing $\lambda_{min}$ and $\lambda_{max}$ such that the full spectral range is covered. The distinct difference between $I_{ph}^{pump}$ and $I_{ph}^{tot}$ 506 under reverse bias correlates with the increased VLWIR response at particular bias voltages. Plotting $I_{ph}^{pump}$ 503 as a function of bias voltage displays a "normal" behavior in the labeled regions I and III of FIG. 5, i.e., increasing with bias at low biases while decreasing at very high biases. This result matches an increase in collection efficiency at low bias, and degradation due to dominant dark currents at high biases. $I_{ph}^{pump}$ 503 in region II reaches a maximum at 0V, indicating non-symmetric hole transport.

Figure 6:
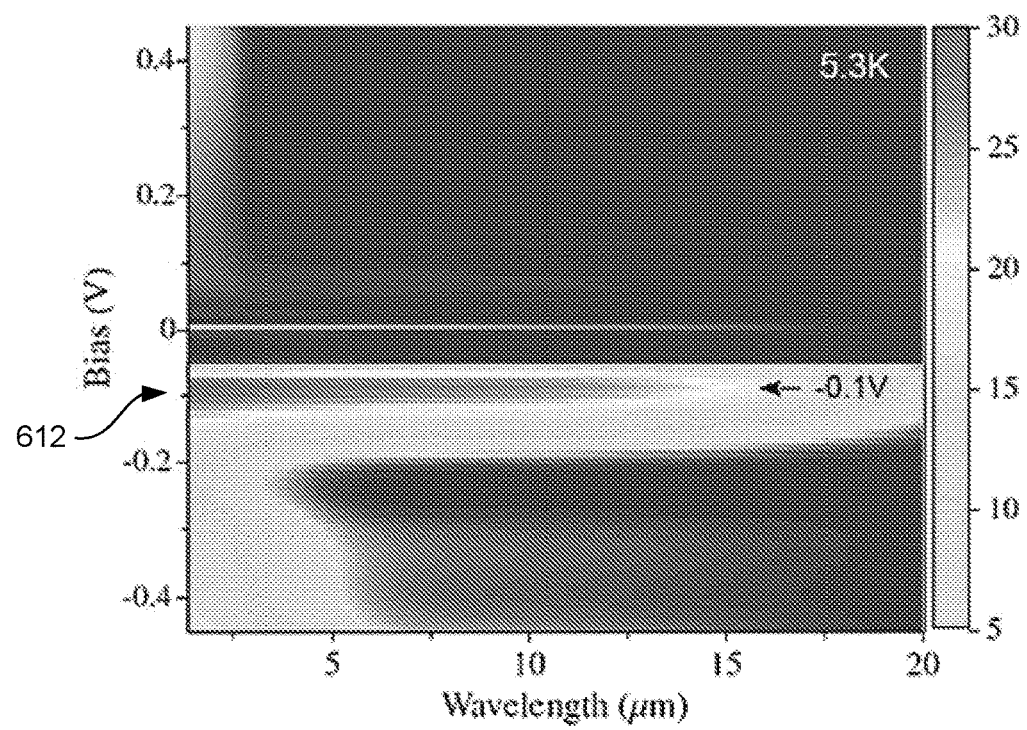
FIG. 6 is a plot of an example of the variation of calculated photocurrents with respect to bias and wavelength in accordance with various embodiments of the present disclosure.

This was also confirmed by measuring non-vanishing photocurrents at 0V, when the structure was excited by optical excitation sources. The inset panel 509 shows the directly measured photocurrent-voltage characteristics using laser diodes with wavelengths of 650 nm and 980 nm as the optical excitation sources. In contrast to the $I_{ph}^{pump}$ curve 503, the $I_{ph}^{tot}$ curve 506 shows a distinct peak 512 at −0.1V, which can also be seen in as a peak 612 in the variation of spectral weights (or calculated photocurrents) depicted in FIG. 6. FIG. 6 shows the variation of calculated photocurrents with bias and $\lambda_{min}$, where $\lambda_{min}$ is the lower limit of integration for calculating the spectral weight of photoresponse (EQN. 4). The wavelength dependency is obtained by varying $\lambda_{min}$ and setting the upper limit $\lambda_{max}$ to 22 µm. The bias voltage corresponds to where a strong VLWIR response occurs.

A number of mechanisms may be considered to explain the long wavelength response, e.g., a hot-carrier bolometric effect and/or impurity-band and free-hole absorption. A bolometric effect, inducing a resistance change, requires an applied bias to detect the signal, and is unlikely to explain the observations since a photovoltaic response was clearly measured. As the p-type absorber 112 (FIGS. 1A and 1B) is highly doped ($1 \times 10^{19}$ cm$^{-3}$), the impurity band is merged with the VB which removes the impurity-to-valence band optical transitions as a possible mechanism. The maximum wavelength limit of the free-hole response varies with Δ, with Δ being the minimum photon energy needed for holes to be photoexcited and emitted over the barrier. It is not straightforward to account for the VLWIR response in terms of the free-hole absorption, unless a new mechanism is introduced to modify the distribution of holes and the emission threshold energy. In this disclosure, a hot-hole induced heating mechanism is discussed which leads to an effective increase in the cold-hole equilibrium temperature and thus elevates the Fermi level towards the top of the barrier.

Figure 7A:
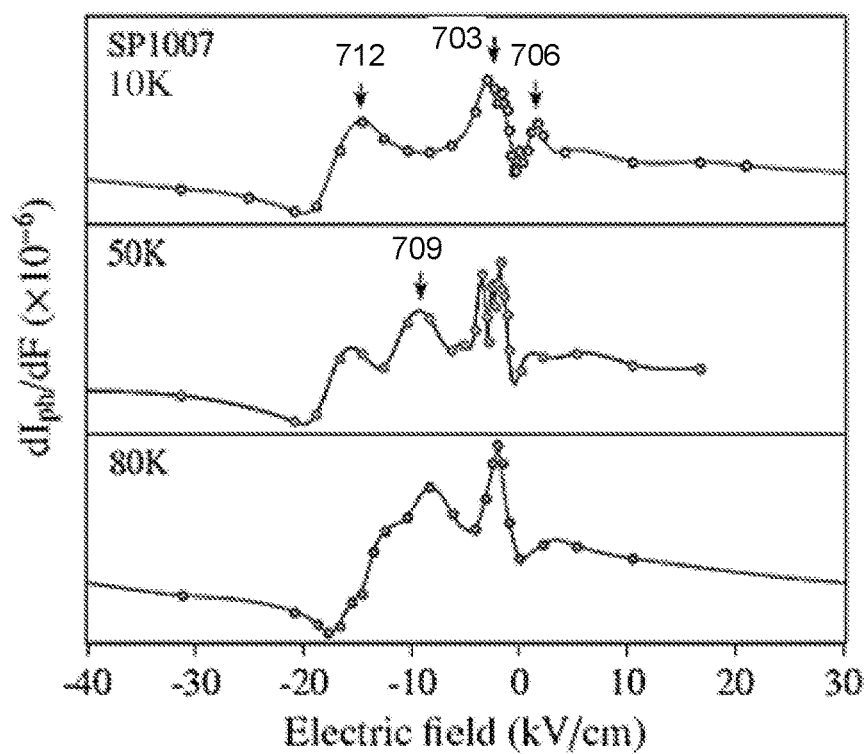
FIGS. 7A, 7E and 7F are plots of derivatives of the photocurrents (spectral weights of photoresponse) of detector samples in accordance with various embodiments of the present disclosure.

Referring to FIG. 7A, shown are plots of derivatives of the photocurrents (spectral weights of photoresponse) for the detector sample SP1007 at 10K, 50K and 80K, respectively. FIG. 7B includes schematic diagrams showing photoexcitation of holes in the absorber 112 without and with hot-hole heating effects. Based on the differentiated spectral weights shown in FIG. 7A, the hole distribution reaches maximums at certain applied electric fields. FIG. 7B shows schematic diagrams 715 and 718 illustrating changes in the hole distribution before heating and after heating, respectively. Since the intensity of the pump source, and hence the photoexcited hot holes, remain unchanged for large biases, the increase in the distribution relates to the hole dynamics occurring in the absorber region 112 (FIG. 7B). Hot carriers can be electrically injected and may be changed by varying the current. The peaks observed in the differentiated photocurrents of FIG. 7A may be ascribed to hot-cold carrier scattering at large biases, which heats up the cold carriers.

Interpreting the low-field (<5 kV/cm) distribution peaks (i.e., peaks 703 and 706 at −2.5 kV/cm and 1.7 kV/cm, or −0.12V and 0.08V, respectively) is not straightforward, as is the case for hot-carrier spectroscopy where the near zero-bias peak is due to ballistic transport. Because of their heavy effective masses compared to electrons, ballistic holes are difficult to identify except for light holes. For the SP1007 samples, holes injected into the absorber 112 (FIG. 7B) mostly stay in the spin-orbit split-off band. In addition, the absorber of our detector structure is much thicker (about 80 nm) than the mean free path (14 nm), which makes ballistic transport unlikely to occur. In the schematic diagrams of FIG. 7B, thermalized holes occupy energy states closer to the barrier; as a consequence, a substantial increase in the collection of holes occurs when a suitable bias is applied. For temperatures of 50 K and 80 K, another peak 709 (FIG. 7A) is observed, which agrees with the signature of the VLWIR response at −0.55 V as shown in FIG. 6. As shown in the VB diagram of FIG. 2, the $Al_xGa_{1-x}As$ graded barrier 109 at the injection side is higher than the Al0.57Ga0.43As constant barrier 115 at the collection side even at 0V for the sample SP1007. This partially explains the occurrence of the hole distribution peaks of sample SP1007 at small biases.

Figure 7D:
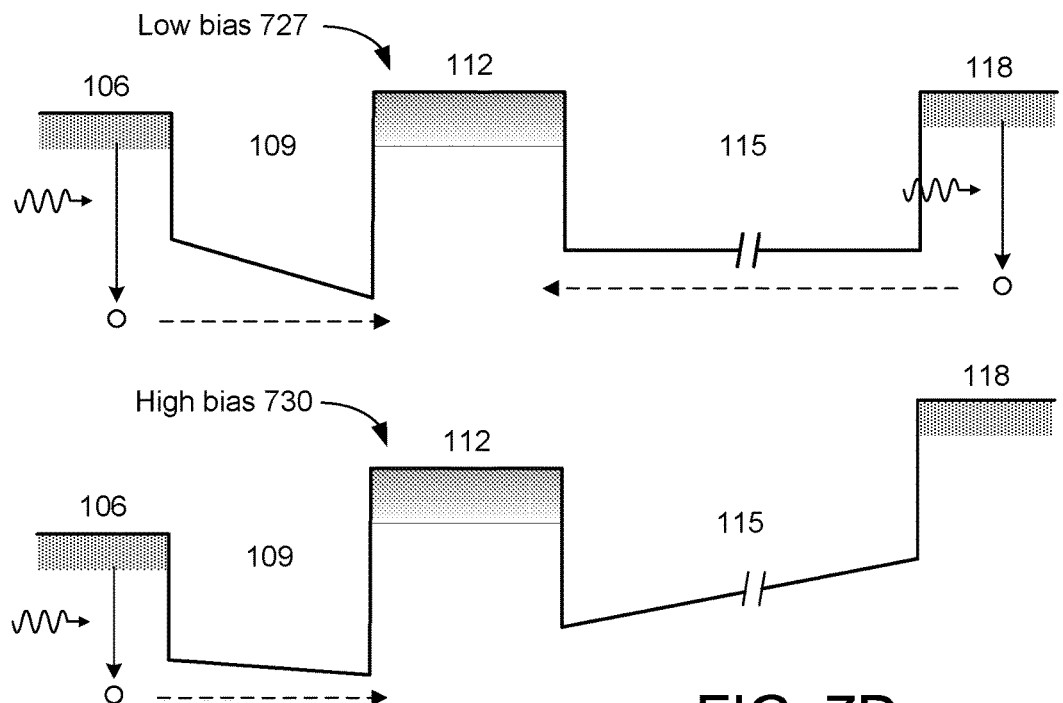

Detailed studies of the spectral response around the zero bias indicate that the low-field distribution peaks are related to the density of hot holes injected, with contributions from both the injector 106 and collector 118. FIG. 7C includes plots of the photoresponse at small reverse biases, which indicate a strong dependence on the applied bias voltages. This feature is related to the co-existence of forward and reverse photocurrents, as shown in the inset panel 721, where the shaded region 724 represents the forward photo-current component for bias at −0.05V. FIG. 7D shows schematic diagrams 727 and 730 illustrating forward and reverse photocurrents at low bias and the reverse component dominating at high bias, respectively. The coexistence of forward and reverse photocurrents is possible since the photoexcited holes can be emitted in both directions, with the photoemission probability strongly depending on the height of the barrier that holes are traversing. This assertion is also clarified by observing a zero-point in the response spectrum which divides the spectrum into two parts (inset panel 721 of FIG. 7C). With increasing reverse bias, photoemission from the collector 118 to the absorber 112 diminishes rapidly. At the same time, the gradient in the graded barrier region 109 decreases with increasing reverse bias, which increases the hot holes injected into the absorber 112. The almost zero-response point at −0.06V (inset panel 721 of FIG. 7C) may indicate a starting point for the injector-to-absorber injection dominating over collector-to-absorber injection. For biases higher than −0.06 V, the VLWIR response increases rapidly and reaches a maximum at −0.1V, almost agreeing with the distribution peak at −0.12V. The interpretation of peak 706 (FIG. 7A) under forward bias is similar to peak 703 (FIG. 7A) with a weak VLWIR response being observed at this point.

Figure 7E:
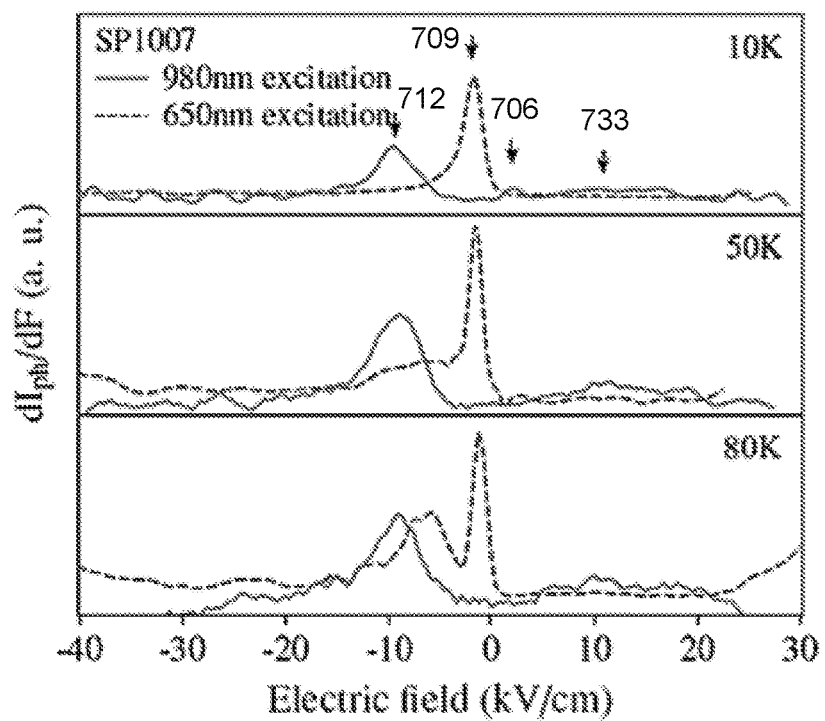
Figure 7F:
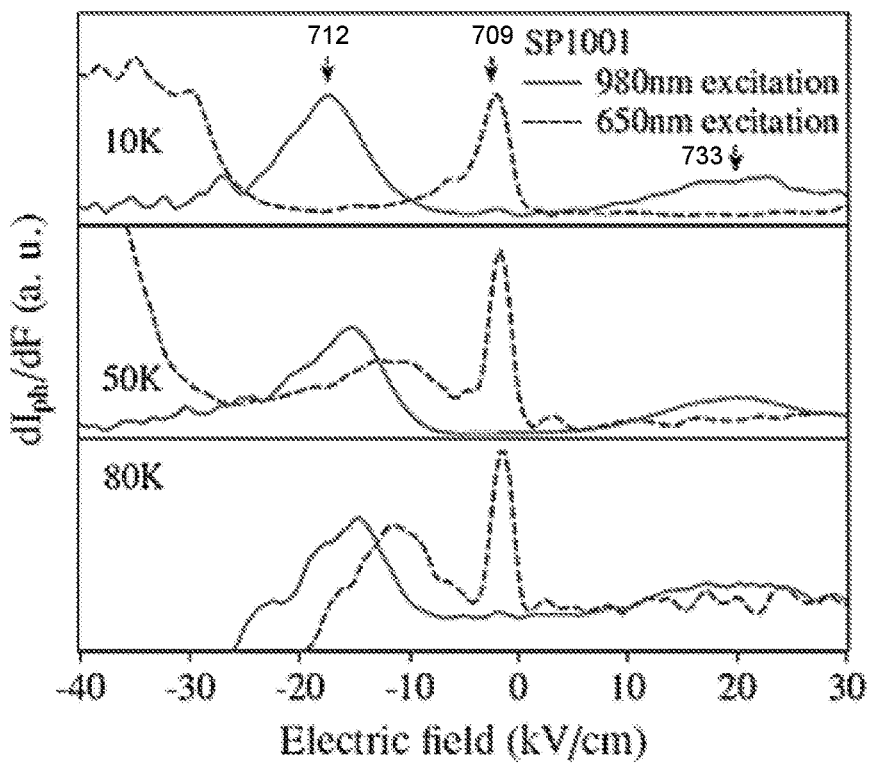

Additional evidence to support this photocurrent analysis is based on the direct measurements of photocurrent-voltage characteristics by using laser diodes as optical excitation sources. FIGS. 7E and 7F show differentiated photocurrents $dI_{ph}^{pump}/dF$ for detector samples SP1007 and SP1001, respectively, directly measured by using laser diodes as excitation optical sources (650 nm and 980 nm excitations) at 10 K, 50 K and 80 K, respectively. Referring to FIG. 7E, $I_{ph}^{pump}$ is the photocurrent obtained by deducting the dark component from the measured currents under illumination. In comparison with FIG. 7A, all of the distribution peaks except for peak 712 can be identified. For this reason, peak 712 may be related to hot holes arising from electrical injection. Photocurrent measurements also identified another peak 733 under forward bias. This peak 733 can be more clearly observed in another sample SP1001 (FIG. 7F), which has the same structure as SP1007 except for the use of a flat $Al_{0.75}Ga_{0.25}As$ barrier in place of the graded barrier region 109 of SP1007. The occurrence of this peak indicates hot-cold interactions at this bias condition at which a relatively strong VLWIR response is observed in SP1001 compared to SP1007. This hot-hole distribution peak at large forward bias has not been observed in previous hot-carrier spectroscopy. A possible cause is multiple passes of holes through the absorber region 112 as a consequence of quantum-mechanical reflections at the interfaces. In both the SP1001 and SP1007 samples, however, the optimum operating condition to see a VLWIR response was found to be in the reverse bias.

In FIGS. 7E and 7F, the different distribution peaks induced by the laser diodes with different wavelengths can be related to hot-hole creation through different absorbing channels. For example, a 650 nm laser gives rise to higher energetic hot holes compared to a 980 nm laser, and thus more heating effects on the cold carriers. As such, the distribution peak can occur at lower bias. Indeed, the near zero-reverse-bias peak was only observed with the 650 nm excitation, probably due to strong absorption through transitions between the spin-orbit split-off (SO) band and the conduction band, which not possible with the 980 nm excitation.

From the photocurrent analysis, the occurrence of a hot-hole distribution peak at a specific bias voltage corresponds to a strong enhancement of the VLWIR response around this bias. This indicates that the origin of the VLWIR response is due to hot-cold hole interactions, which also give rise to the observed hole distribution peaks in FIGS. 7A and 7E. In the case of electron heating through electron-electron interactions, electrons may be thermalized at a higher temperature than that of the lattice as a result of hot-electron injection. Similarly, such a heating effect can occur for the case of hot-hole injection. In addition, thermalization of hot holes with cold holes was identified as a necessary transient step toward their relaxation down to the lattice temperature. For p-type semiconductors, photoexcitation results in population of holes from the heavy-hole (HH) band to the light-hole (LH) band or the spin-orbit split-off (SO) band (depending on the photon energy). Hot holes in the LH or SO band then undergo a fast inter-valence band scattering process (sub-picosecond) back to the HH band via the emission of optical phonons. Thereafter, the cooling of high-energetic HH holes proceeds through the intra-band hole-hole or hole-phonon scatterings. The former process dominates since it occurs on a very fast time scale (sub-picosecond) compared to the picosecond timescale for the latter. Consequently, hot holes in the HH band thermalize with cold holes, followed by a longer cooling process (via phonon emission) in on timescale of several tens of picoseconds. In this picture, the initial process of phonon emission takes place rapidly compared to the latter cooling of the thermalized holes. An important reason for this may be a hot-phonon bottleneck. The phonon concentration increases when relaxation proceeds, which reduces the rate of phonon emission in the latter cooling process. Furthermore, the energy-loss rate ($P_c$) of hot carriers decreases when cooling occurs because of a lowering of the carrier temperature ($T_c$), as shown in the following expression for the emission of longitudinal-optical (LO) phonons:

$$P_c(T_c) = (\hbar\omega_{LO}/\tau_{avg})\exp(-\hbar\omega_{LO}/kT_c) \qquad \text{EQN. 7}$$

where $\tau_{avg}$ is a time constant and $\hbar\omega_{LO}$ is the energy of the LO phonon. This also partially accounts for the longer relaxation time of the thermalized holes.

The above hot-hole relation scheme essentially supports the existence of thermalized holes in the absorber 112 with a relatively long lifetime (several tens of picoseconds). This is illustrated in the schematic diagram 718 of FIG. 7B. By treating thermalized holes with an equilibrium distribution, i.e., represented by a quasi-Fermi level ($E_F$) and an effective temperature ($T_h$), $E_F$ of this "hot" hole system in the absorber 112 lies deep in the VB, and is accompanied by a substantially higher $T_h$ than the temperature of the lattice, compared with the original state illustrated in the schematic diagram 715 of FIG. 7B. Such a "hot" distribution greatly reduces the photoemission threshold energy for hole photoexcitation and escape over the barrier, which is believed to be the main reason for the rise of the VLWIR response. This "hot" hole system exists on a picosecond time scale, which is sufficient to allow photoexcitation and emission over the barrier 115. However, a genuine equilibrium distribution of the thermalized cold holes in the absorber 112 cannot be fully identified. In the simulated photoresponse of FIG. 4A using the escape cone model, the agreement between model calculation and experiment becomes worse at higher biases. This can also be seen from the different profile of the photoresponse at higher biases. This may be due to the non-equilibrium distribution of thermalized holes, especially at higher biases.

Figure 8A:
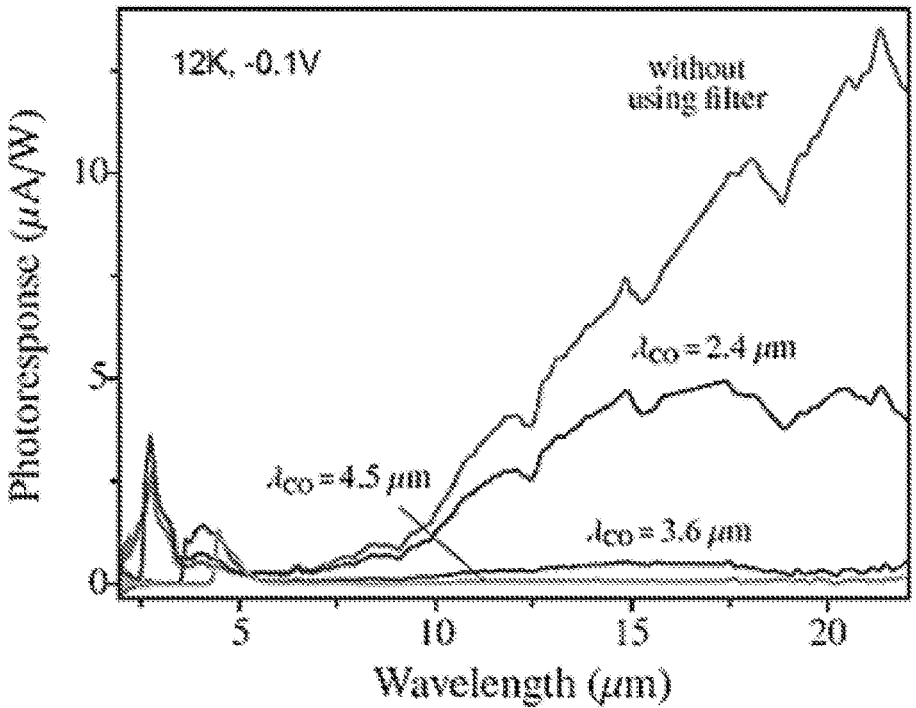
FIGS. 8A, 8B and 8C are plots of examples of photoresponse of a detector sample of FIGS. 1A and 1B at different reverse bias levels in accordance with various embodiments of the present disclosure.

The occurrence of the VLWIR response as a result of hot-cold hole interactions implies that it can be tuned by altering the injection of hot holes. For example, hot-hole induced heating effects and the corresponding VLWIR response may be removed by blocking the optical pump source. The photoresponse has been measured using long-pass filters, as shown in FIG. 8A with different cut-on wavelengths ($\lambda_{CO}$). A longer cut-on wavelength ($\lambda_{CO}$) results in less energetic hot holes injected, and hence a reduced heating effect. This explains the decrease in the VLWIR response with increasing $\lambda_{CO}$. The VLWIR response is greatly reduced by using a $\lambda_{CO}=3.60$ μm filter, and fully suppressed in the entire spectral range by using a $\lambda_{CO}=4.50$ μm filter. Photoexcited holes are unable to surmount the graded barrier 109 (with a maximum at 0.42 eV). This indicates that light with a wavelength below 4.5 μm is required to give rise to the hot-hole effects. Another measurement with a 2.4 μm cut-on filter in place of the 3.6/4.5 μm filter allowed immediate observation of the VLWIR photoresponse, as shown in FIG. 8A.

Figure 8B:
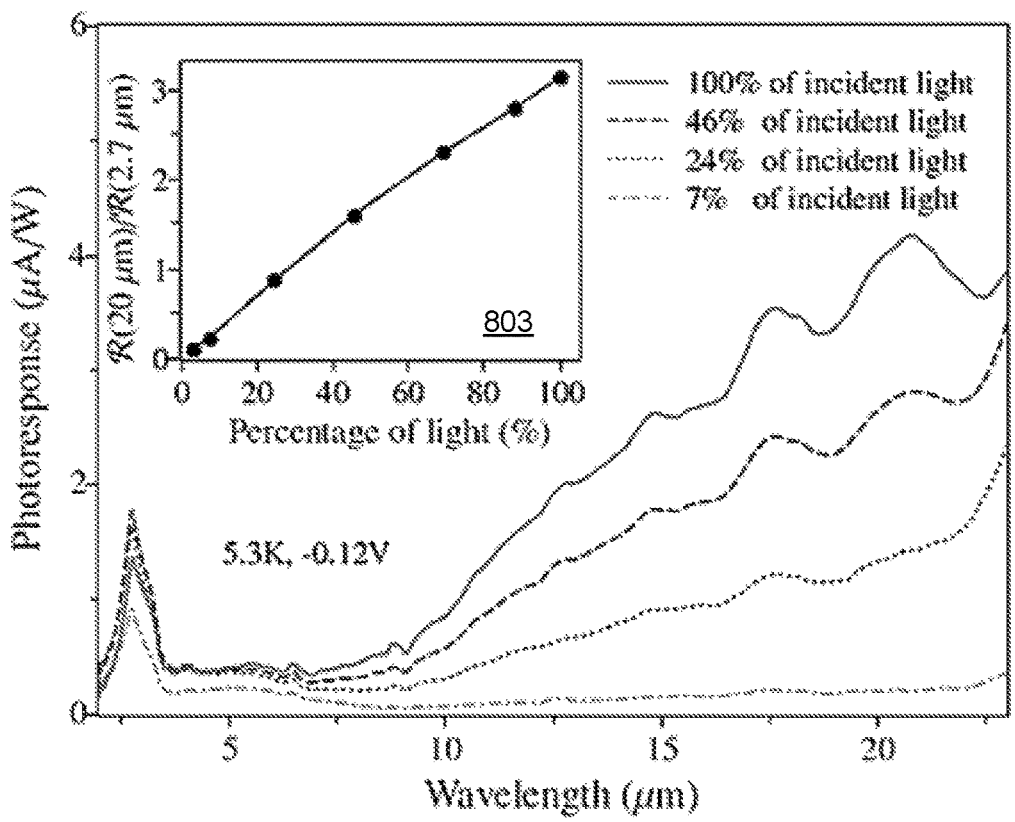

Thermalization of cold holes varies with the concentration of injected hot holes. A highly excited carrier gives a fraction $N/(N+N_c)$ of its excess energy to a cold carrier, where N and $N_c$ are the excited carrier concentration and a critical concentration, respectively. Therefore, increasing the concentration of hot holes injected can effectively increase the hole temperature. FIG. 8B shows the dependence of the VLWIR response to different intensities of incident light. Under illumination at low intensity, the photoresponse in the VLWIR range is far less than that in the short wavelength region. The inset panel 803 shows the ratio of responsivity as a function of the percentage intensity of the incident light. However, the VLWIR response exceeds the short-wavelength counterpart when the incident light intensity increases above 24%. A 100% light intensity leads resulted in about $10^{16}$ cm$^{-3}$/s hot holes being injected into the absorber 112.

All of the above measurements, using long-pass filters and varying the light intensity, indicate that the VLWIR response is closely related to the optically or electrically injected hot-hole concentration. Importantly, there is a consistency between biases applied at which VLWIR response rises, and where the differentiated photocurrents exhibit peaks. This justifies the origin of the VLWIR response as a result of hot-hole induced heating effects. This principle differs from hot-carrier driven photodetection including photovoltaic, thermoelectric, and bolometric effects. Although demonstrated here in III-V semiconductor based material systems, this mechanism should be applicable to other materials, as the carrier heating effect is based on carrier-carrier interactions. The performance of the resulting semiconductor hot-hole detectors can be tailored using band-structure engineering.

As previously discussed, the observed VLWIR response may be attributed to the bolometric effect and/or an impurity band/free-hole carrier based response. Possible optical transitions contributing to photon absorption by the p-type GaAs absorber in the infrared range include the impurity band-to-valence band transition, and intra-valence and/or inter-valence band transitions, both of which are free-carrier type effects. Increasing the doping concentration shifts the absorption peak and broadens the absorption width, as a result of enhanced carrier scatterings, and the shifting and/or increasing of the Fermi level and/or free-carrier plasma frequency, respectively. The absorber, though, has a major effect on the bolometric response and impurity-band absorption.

Figure 8C:
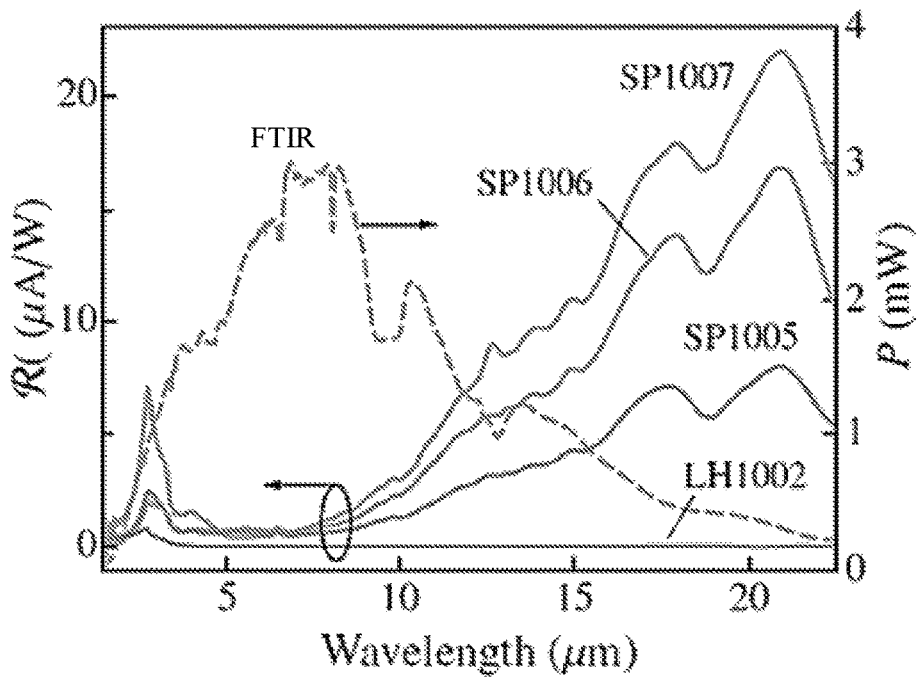

Referring to FIG. 8C, shown is a comparison of response for test samples SP1005, SP1006, and SP1007 and a control sample LH1002. The active regions of samples SP1005, SP1006, and SP1007 include (from top to bottom) a 400 nm-thick undoped $Al_{0.57}Ga_{0.43}As$ constant barrier, a p-type GaAs layer (absorber) (p=1×10$^{19}$ cm$^{-3}$), and an 80 nm-thick $Al_xGa_{1-x}As$ graded barrier with x linearly varying from 0.75 (top) to 0.45 (bottom). The thicknesses of p-type GaAs absorbers are 20 nm, 50 nm and 80 nm for SP1005, SP1006 and SP1007, respectively. The absorber of sample LH1002 is 18.8 nm-thick p-type doped (p=1×10$^{19}$ cm$^{-3}$) GaAs, which is placed between $Al_xGa_{1-x}As$ barriers with the same Al fraction (x=0.57) and thickness (60 nm). The active region is sandwiched between two p-type (p=1×10$^{19}$ cm$^{-3}$) GaAs ohmic contact layers. The activation energy ($\Delta$) is associated with the p-type GaAs/$Al_xGa_{1-x}As$ junction, defined as the energy difference between the Fermi level of p-type GaAs and $Al_xGa_{1-x}As$ barrier (valence-band edge). It is calculated to be 0.25 eV, 0.32 eV and 0.42 eV for the barriers with Al fractions of 0.45, 0.57 and 0.75, respectively, by taking into account band offsets at the heterointerface and doping-induced band gap narrowing.

Detectors were processed by wet etching to produce square mesas, followed by Ti/Pt/Au ohmic contacts evaporated onto the top and bottom p-type GaAs contact layers. A top ring contact with a window opened in the center was fabricated to allow for front-side illumination. The experiments were carried out on 400×400 µm² mesas with an open area of 260×260 µm². The optical power spectrum of the FTIR spectrometer used in the experiment (incident onto the sample with an active area of 260×260 µm²) is also shown. By measuring the control sample LH1002 which contains the same GaAs absorber as the samples SP1005, SP1006, and SP1007 displaying a VLWIR response, we can exclude these two mechanisms as a cause of the VLWIR response. As can be seen in FIG. 8C, LH1002 responds as expected, in accordance with the "$\lambda_c$=hc/$\Delta$" rule. Comparison of LH1002 (having a symmetric flat-barrier configuration) with SP1005, SP1006, and SP1007 (with asymmetric band alignment) indicates that the VLWIR response is particularly dependent on the structure details.

Figure 9A:
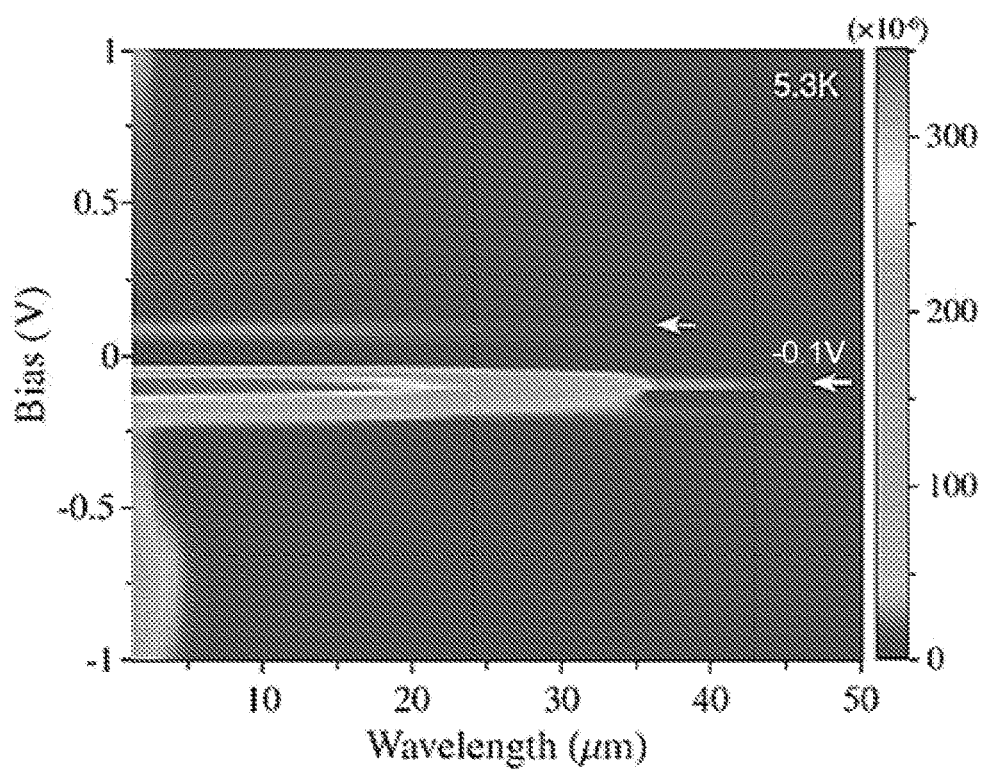
FIG. 9A is an example of the spectral weight (SW) as a function of bias and wavelength of the hot-carrier photodetector of FIGS. 1A and 1B in accordance with various embodiments of the present disclosure.
Figure 9B:
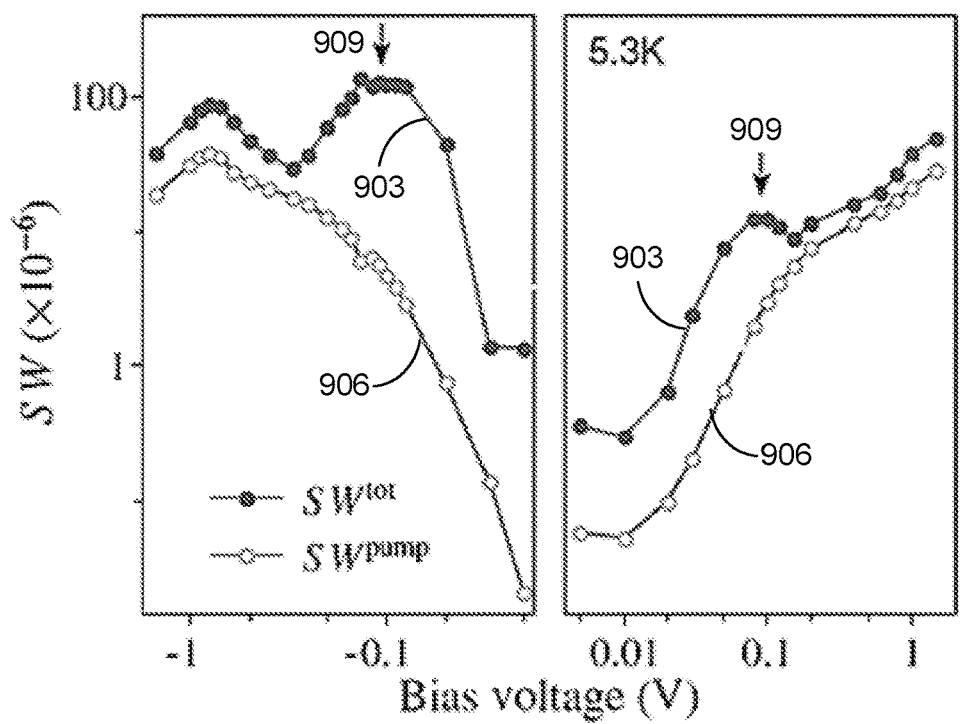
FIGS. 9B and 9C are plots of spectral weight (SW) and differentiated SW of the hot-carrier photodetector of FIGS. 1A and 1B in accordance with various embodiments of the present disclosure.

Additionally, the bolometric response, proportional to the temperature variation of the absorber upon photon absorption and the corresponding resistance change, monotonically increases with increasing bias. This effect contrasts with the strongly non-monotonically bias-dependent VLWIR response, as shown in the calculated spectral weight (SW), defined as $$SW \propto \int_{\lambda_{min}}^{\lambda_{max}} R(\lambda) d\lambda \qquad \text{EQN. 8}$$

where $R(\lambda)$ is the spectral responsivity. FIG. 9A shows the variation of the SW of sample SP1007 with bias and $\lambda_{min}$, calculated using EQN. 8 where $\lambda_{max}$ is 55 µm. The VLWIR response reaches a maximum at about –0.1 V. FIG. 9B illustrates the bias-dependent SW. The values used for $\lambda_{max}$ determine $SW^{tot}$ 903 and $SW^{pump}$ 906, with $SW^{tot}$ 903 corresponding to all of the holes being collected. $SW^{pump}$ 906 was calculated by using $\lambda_{max}$=2.95 µm (e.g., 0.42 eV, the maximum of the graded barrier). $SW^{tot}$ 903 displays two maxima 909 compared to $SW^{pump}$ 906, due to the bias-dependent VLWIR response.

For these reasons, the bolometric effect cannot be considered to be contributing to the VLWIR response. Also, the impurity-band to valence-band optical transition can barely have any influence on the response, as the impurity band is actually merged with the VB at p=1×10$^{19}$ cm$^{-3}$. Another possible doping-related effect is dopant-correlated potential fluctuations and the relevant tailing states at the band edge; however, absorbing photons with energies as high as the value $\Delta$ are needed to excite holes in these band tailing states and allow them to escape over the barrier. Instead, the two-phase hot-hole mechanism is used to explain the VLWIR response: hot-cold hole energy transfer, and the response of high-energy cold holes to the VLWIR radiation. The dominant absorbing mechanism will then be based on the intra-band free-hole absorption.

The short-wavelength portion of the light from the FTIR spectrometer, with a power spectrum as shown in FIG. 8O, or more generally from an external optical excitation source (denoted as the "pump" source), generates the photoexcited hot holes and establishes the VLWIR response. The pump-excited holes with energies higher than all of the barriers can be described by a three-dimensional drift model, given by:

$$I_{ph}^{pump} = e \cdot v(F) \int_\Delta^{+\infty} N(\epsilon) d\epsilon \qquad \text{EQN. 9}$$

where $I_{ph}^{pump}$ is the pump current. $N(\epsilon)$ is the concentration of holes with energy $\epsilon$. The electric field F is evaluated across the barrier regions. The drift velocity $v(F)$ is associated with an empirical fitting parameter—the mobility, which is determined by both the doped GaAs absorber and undoped AlGaAs barrier. Despite its simplification from EQN. 4, EQN. 9 accounts for the current-voltage characteristics reasonably well in most devices. Taking the derivative of $I_{ph}^{pump}$ with respect to F gives:

$$\frac{dI_{ph}^{pump}}{dF} = e \cdot \frac{dv(F)}{dF} \int_{\Delta}^{+\infty} N(e)d\epsilon - e \cdot v(F)\frac{d\Delta}{dF} \cdot N(\Delta) \qquad \text{EQN. 10}$$

in which dΔ/dF is mainly determined by the image-force barrier lowering and tilting of the graded barrier by applied bias. In the high-field region, the first term of EQN. 10 vanishes since v(F) approaches a constant saturation velocity. The energy distribution of holes is thus proportional to the differentiated $I_{ph}^{pump}$, which consists of photocarriers with different energies. $I_{ph}^{pump}$ can be evaluated using EQN. 8 or can be directly measured during experiments.

Figure 9C:
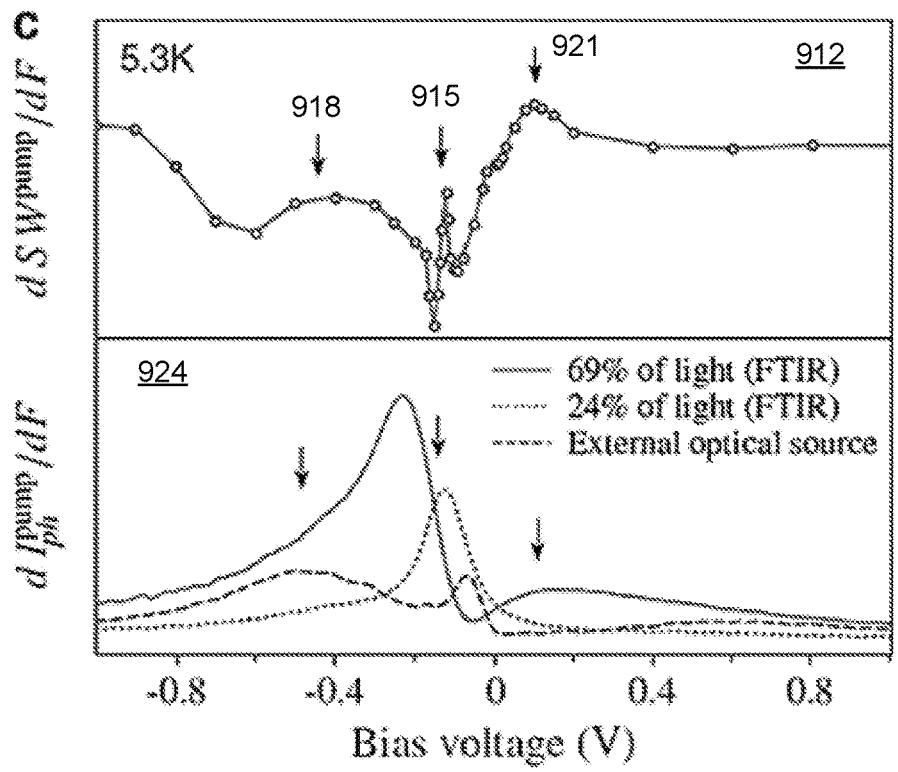

As shown in the top panel 912 of FIG. 9C, the differentiated SW displays three distribution peaks at −0.12V (915), −0.40V (918) and 0.10V (921), which were confirmed by photocurrent-voltage characteristics measured using different optical excitation sources, as illustrated in the bottom panel 924 of FIG. 9C, In terms of hot-carrier spectroscopy, the occurrence of distribution peaks is a sign of a hot-cold carrier interaction which leads to the excitation of cold carriers into higher energy states. Under a low applied bias, the electric field can be non-uniformly distributed, mainly across the graded barrier region. With increasing negative bias, the graded barrier is tilted towards a horizontal shape as illustrated in FIG. 7B. An increase in the injection of hot holes and enhanced hot-cold interactions can then be expected, which consequently leads to an increase in cold holes occupying higher energy states. This explains the distribution peak at −0.12V (915). When the bias is further increased, the electric field is distributed uniformly throughout the structure. The lowering of the constant barrier by the image-force effect will facilitate the escape of higher energy cold holes over the barrier, which leads to another distribution peak at the higher negative bias of −0.40 V (918).

The dynamics of the hot-cold hole interaction can also be observed using picosecond infrared spectroscopy, where photoexcited holes in the light-hole (LH) band or spin-orbit split-off (SO) band initially relax, mainly through the emission of optical phonons, typically within a sub-picosecond timescale. The subsequent relaxation proceeds through the dominant hole-hole scattering mechanism, which causes a redistribution of energies among the hot and cold holes. As a consequence, the holes reach a thermalized state at much higher energies compared to their original states. Further relaxation typically takes relatively long times (e.g., tens of picoseconds). These "hot" holes are thus able to be excited by absorbing VLWIR photons and escape over the barriers, contributing to the photocurrent. This mechanism is believed to be the main cause of the VLWIR response.

To verify such a photoresponse picture, an escape-cone model was employed to simulate the response spectra. In this model, free-carrier absorption described by the Drude theory was used to produce the general spectral profile. The threshold energy, which was a fitting parameter in the simulation, determines the long-wavelength end of the response. Using a value of 0.012 eV, the modeled response was in general agreement with the experiment measurements as shown in FIG. 4B. However, a sharp peak appeared at 25.3 μm (or 395 cm$^{-1}$) which became stronger as the bias was increased. Another peak at 35.6 μm (or 281 cm$^{-1}$) appeared at −0.08 V and sharply increased with negative bias. It was found that these two peaks were close to the two plasmon-phonon coupling modes calculated for the equilibrium, i.e., 23 μm and 42 μm (or 430 cm$^{-1}$ and 236 cm$^{-1}$) for doping concentration at p=1×10$^{19}$ cm$^{-3}$. The injection of hot holes may disturb the distribution of cold holes by exciting some of the cold holes up to higher-energy states, which may affect the coupling, as it is different from the equilibrium. Despite this hot-hole effect, comparison between the two sharp response peaks and the coupling modes showed the important role of the phonon-plasmon coupling in modifying the response. In addition, the general spectral profile of the VLWIR response agreed with the escape-cone model curve; and in particular, the features associated with GaAs and AlAs-like phonons.

A hot-hole induced photoresponse can significantly improve the energy efficiency of devices. Rather than heating the lattice and degrading the performance of devices, hot holes transfer their energy to heat up cold carriers. Thereafter, the thermalized cold carriers absorb photons and contribute to the photocurrent. For example, the concept may extend the absorbing band of a solar cell into the infrared range. The resultant cold-carrier heating can be controlled by varying the energy and concentration of injected hot holes to meet the demands of specific device applications. For detector development, a hot-hole detector can be realized by integrating it with a light-emitting diode (LED). The device structure will be similar to an optical up-converter. In principle, the operating mechanism of the hot-hole detector will be opposite to that of the up-converter. The LED is used to excite holes into higher energy levels and provide hot holes injected into the absorber. The VLWIR detection can then be initiated by turning the LED on or off.

The hot-hole VLWIR response can also be used to realize THz detectors. Importantly, owing to hot-hole tuning, the present detector showed a response in the VLWIR range, although it has value of Δ=0.32 eV. In comparison, conventional detectors with the same Δ as the hot-hole detector observe no VLWIR photoresponse. Without the hot-hole tuning effect, a conventional detector with a threshold wavelength of 100 μm needs Δ=0.0124 eV and has an operating temperature limited to under 4.2K.

A VLWIR photodetector has been disclosed with a threshold beyond the spectral limit set by the "$\lambda_c$=hc/Δ" rule. This means that $\lambda_c$ and Δ can be respectively optimized to design specific wavelengths for detection, whilst simultaneously minimizing the detector noise and dark current. The extended photoresponse in the VLWIR range may be due to the injected hot holes transferring energy to cold holes in the absorber 112 of the detector 100 (FIGS. 1A and 1B). The hot-hole enhanced response is tailorable by varying the energy of the hot holes injected.

Figure 10:
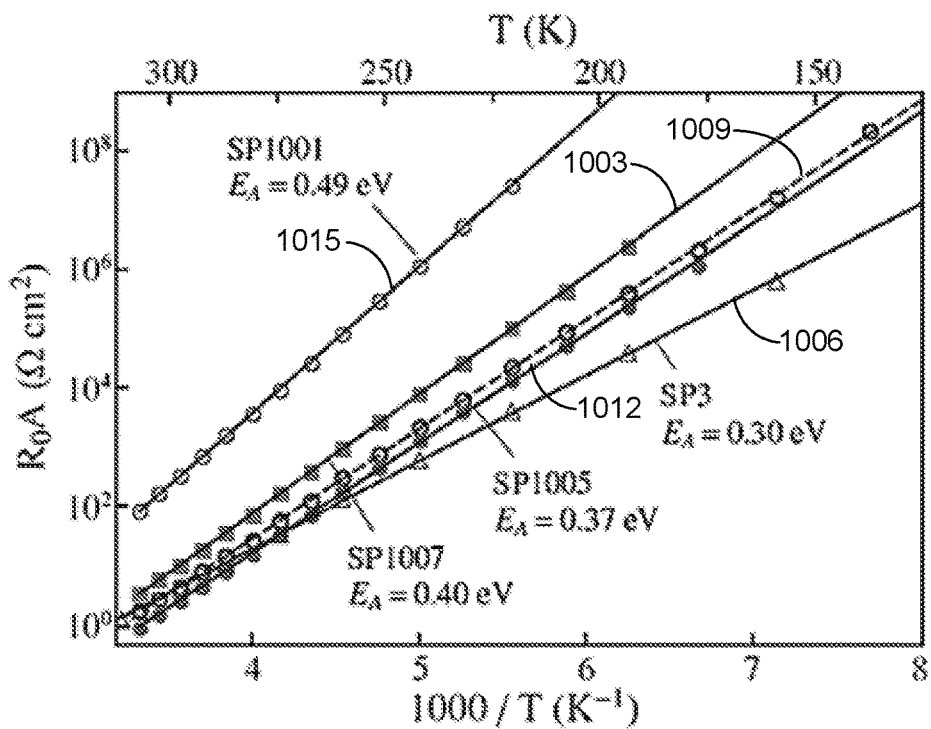
FIG. 10 is an example of Arrhenius plots for various detector samples in accordance with various embodiments of the present disclosure.

As described, a long-wavelength response may be produced by a short-wavelength detector. A built-in potential can sweep photocarriers out of the active region without an external field. In addition to optimizing optical performance of the active region, the detectivity is mainly limited by the dark current in photoconductive mode or $R_0A$ ($R_0$ is the zero-bias differential resistance and A is the active area) in photovoltaic mode, and determined by the activation energy ($E_A$). This means that detectors with longer operating wavelength usually come with reduced $E_A$ and hence reduced detectivity. The activation energy can be obtained from the $R_0A$-T behavior. The $R_0A$ values can be calculated by using experimental I-V-T data and plotted as a function of temperature in the logarithmic scale as Arrhenius plots. Referring to FIG. 10, shown is an example of Arrhenius plots of $R_0A$ against 1000/T to determine $E_A$ for a detector sample such as, e.g., SP1007 (curve 1003). A symmetrical flat-band GaAs/Al$_{0.57}$Ga$_{0.43}$As detector sample SP3 (curve 1006) is included for comparison. Fittings to the Arrhenius plots give activation energies ($E_A$) of 0.30 eV and 0.40 eV for samples SP3 (curve 1006) and SP1007 (curve 1003), respectively. The values of $E_A$ can be considered as those of Δ, which satisfactorily agree with the design values of 0.32 eV and 0.42 eV that correspond to the p-type GaAs/Al$_{0.57}$Ga$_{0.43}$As and GaAs/Al$_{0.75}$Ga$_{0.25}$As junctions, respectively.

Figure 11A:
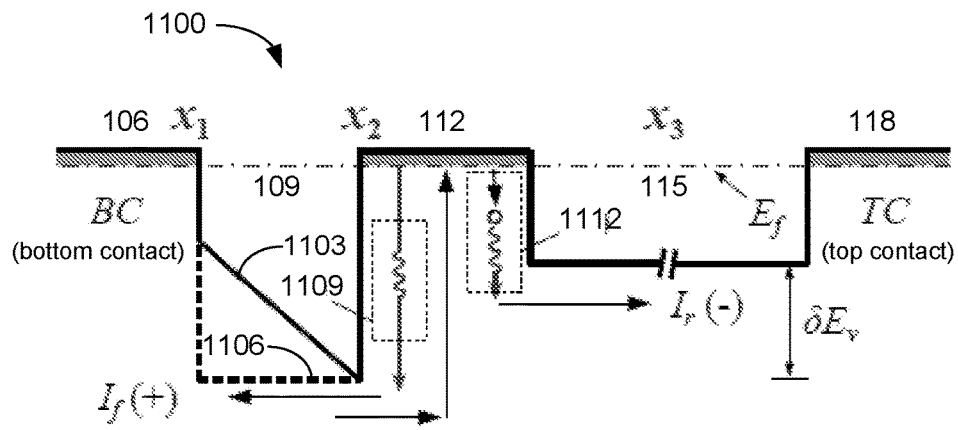
FIG. 11A is a VB diagram of a hot-carrier photodetector in accordance with various embodiments of the present disclosure.

Referring to FIG. 11A, shown is an example of a valence-band (VB) diagram 1100 including a nonsymmetrical band alignment produced by an Al$_x$Ga$_{1-x}$As graded barrier 109. The VB diagram 1100 illustrates a graded barrier (solid line 1103) and a flat barrier (dashed line 1106) structure with bidirectional photocurrents, where $I_f(+)$ and $I_r(-)$ represent the transports of holes under forward and reverse biases, respectively. The vertical undulating lines represent photon absorption. For comparison, different gradients of Al fractions were investigated. TABLE 1 includes the GaAs/Al$_x$Ga$_{1-x}$As photovoltaic detector parameters for three different detector samples. The active region of the detectors includes a 400 nm-thick undoped Al$_{x3}$Ga$_{1-x3}$As constant barrier 115 with constant $x_3$ of TABLE 1, a p-type GaAs absorber (emitter) 112 doped to $1 \times 10^{19}$ cm$^{-3}$, and a flat (SP1001) or graded (SP1005 and SP1007) 80 nm-thick Al$_x$Ga$_{1-x}$As barrier 109 (where x varies from $x_2$ to $x_1$ of TABLE 1). The barriers with Al fractions of 0.75, 0.57 and 0.45 give the thresholds of 3 μm, 4 μm and 5 μm, respectively.

TABLE 1

| Sample No. | $x_1$ | $x_2$ | $x_3$ | Emitter thickness (nm) |
|---|---|---|---|---|
| SP1001 | 0.75 | 0.75 | 0.57 | 80 |
| SP1005 | 0.45 | 0.75 | 0.57 | 20 |
| SP1007 | 0.45 | 0.75 | 0.57 | 80 |

Figures 11B, 11C:
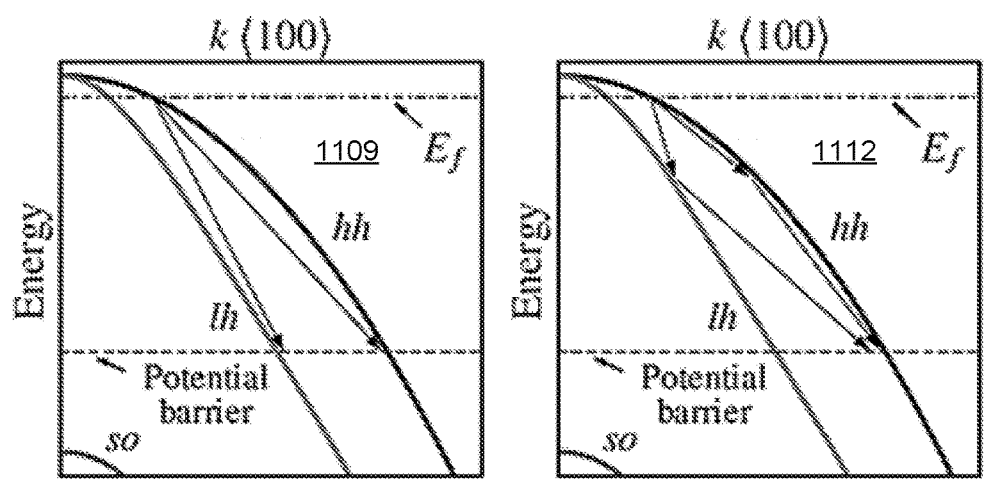
FIGS. 11B and 11C are schematic representations of examples of transitions between the valence bands of the VB diagram of FIG. 11A in accordance with various embodiments of the present disclosure.

Referring to FIGS. 11B and 11C, shown are examples of intervalence band (IVB) transitions in the p-type emitter. FIG. 11B schematically illustrates regular (indirect) transitions between the valence bands corresponding to photon absorption 1109 in FIG. 11A. The notations hh, lh and so denote the heavy-hole, light-hole and spin-orbit split-off bands, respectively. FIG. 11C schematically illustrates an example of the two-step excitation of holes by energy transfer between holes followed by photon absorption, corresponding to photon absorption 1112 in FIG. 11A.

To determine $E_A$ for each detector sample, $R_0A$ values are plotted as a function of temperature as shown in FIG. 10. All data was based on measurements on 400×400 μm$^2$ mesas. Additional data of an 800×800 μm$^2$ mesa (curve 1009) for SP1005 is also included for comparison. The $R_0A$ value for the symmetrical GaAs/Al$_{0.57}$Ga$_{0.43}$As detector sample SP3 (curve 1006) is also shown for comparison. In the vicinity of zero bias, the dark current only originates from the thermionic emission, giving rise to the Arrhenius plots of $R_0A$ versus temperature. The $E_A$ values were determined to be 0.37 eV, 0.40 eV and 0.49 eV for samples SP1005 (curve 1012), SP1007 (curve 1003), and SP1001 (curve 1015), respectively. Except for SP1001, the obtained $E_A$ values are comparable to the designed internal work function (Δ) of about 0.4 eV, corresponding to the Al$_{0.75}$Ga$_{0.25}$As barrier. The $R_0A$-T characteristic indicating an $E_A$ of about 04 eV demonstrated that both SP1005 and SP1007 behave like a 3 μm threshold detector.

Figure 12A:
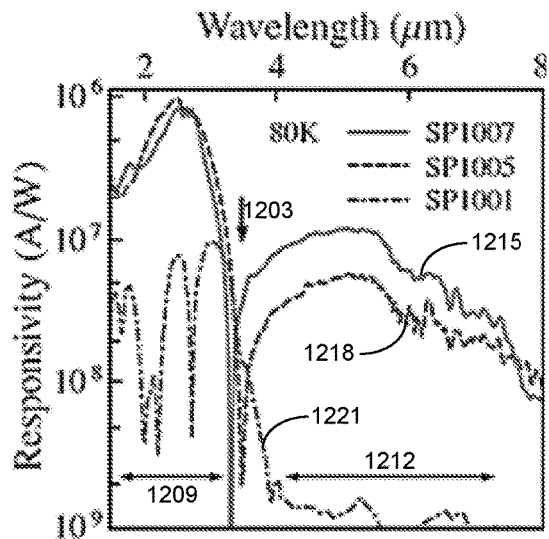
FIGS. 12A and 12B are plots of examples of photoresponse of various detector samples in accordance with various embodiments of the present disclosure.
Figure 12B:
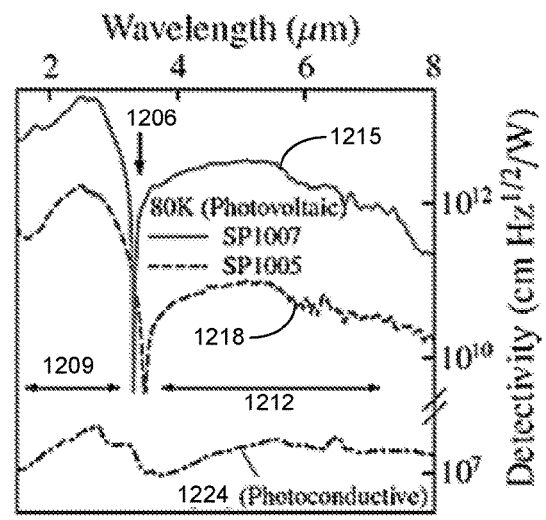

Referring next to FIGS. 12A and 12B, shown are the photovoltaic responsivity and detectivity (D*) at 80K, respectively. The vertical arrows 1203 and 1206 indicate the occurrence of a zero response due to bidirectional photocurrents simultaneously existing in the device. The response over range 1209 corresponds to the forward photocurrents $I_f(+)$ and the response over range 1212 corresponds to the reverse photocurrents $I_r(-)$. Long-wavelength response beyond 4 μm was observed in samples SP1007 (curve 1215) and SP1005 (curve 1218), but not observed in flat-barrier sample SP1001 (curve 1221).

Figure 12C:
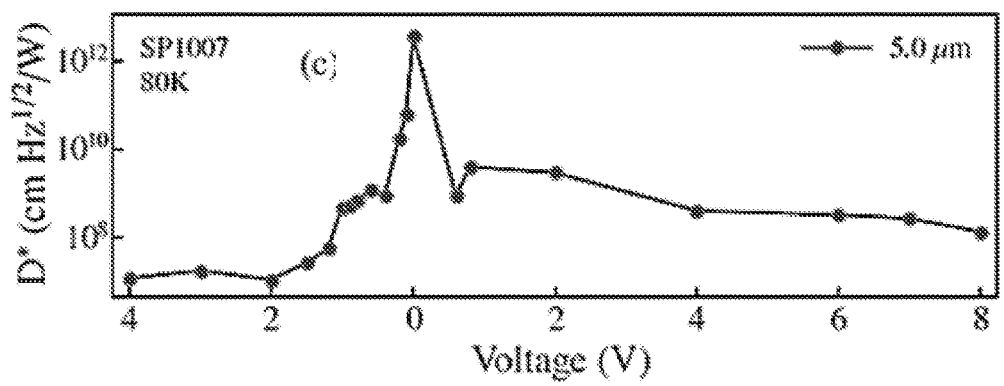
FIG. 12C is a plot of an example of detectivity (D*) of a detector sample in accordance with various embodiments of the present disclosure.

D* was obtained by using $D^* = \mathcal{R}(2qJ + 4kT/R_{\mathit{diff}} A)^{1/2}$, where $\mathcal{R}$ is the responsivity, J is the dark current density, and $R_{\mathit{diff}}$ is the differential resistance. At zero bias where the shot noise vanishes, this expression can be reduced to the typical formalism in terms of the Johnson noise. As a result of the single-emitter (absorber) structure, the absorption is quite low, leading to very low responsivity values. However, the dark currents are extremely low around zero bias. This is in contrast to the slightly higher dark current in QD quantum cascade structures, possibly caused by residual carrier leakage into resonant states of the barrier. The 80K photovoltaic detectivity of the SP1007 sample at 5 μm was determined to be $3.5 \times 10^{12}$ cmHz$^{1/2}$/W with zero bias. FIG. 12C shows the bias dependent D* for a wavelength of 5 μm, which confirms optimum photovoltaic operation.

An interesting feature in the spectral response of graded barrier samples SP1007 and SP1005 is the large redshift in the threshold wavelength under photovoltaic operation (doubling the operating wavelength range). Notice that the flat-barrier sample SP1001 (curve 1221 of FIG. 12A) does not respond beyond 4 μm, which is similar to the symmetrical GaAs/Al$_{0.57}$Ga$_{0.43}$As detector sample SP3. Therefore, the graded barrier samples with an $E_A$ of about 0.4 eV act as 8 μm threshold detectors that are capable of operating in the photovoltaic mode up to 8 μm while having the $R_0A$ value similar to that of a 3-μm threshold detector. Improvement by a factor of about 10$^7$ in photovoltaic detectivity was expected from the $R_0A$ improvement. Experimentally, the detector sample SP1007 (curve 1215) showed a detectivity that was >10$^5$ times higher than previous 30-period photoconductive detectors (curve 1224 of FIG. 12B).

Another observed characteristic was the zero responsivity values around 3.4-3.5 μm, which indicate the co-existence of bidirectional photocurrents in the sample that yield a vanishing point on the spectrum. This is not surprising since photoexcited holes in the emitter can emit over both sides of the barriers, which normally gives rise to the thresholds of 3 μm and 4 μm, respectively, corresponding to the Al$_{0.75}$Ga$_{0.25}$As and Al$_{0.57}$Ga$_{0.43}$As barriers, respectively. The VB 1100 of FIG. 11A illustrates these two components of photocurrents $I_f(+)$ and $I_r(-)$. The flat-barrier sample SP1001 only shows photovoltaic response up to 3.9 μm, approaching the threshold wavelength of the Al$_{0.57}$Ga$_{0.43}$As barrier. However, spectral response up to 8 μm was observed in both graded barrier samples SP1005 and SP1007, which introduces a new mechanism of threshold tuning, namely the hot-hole effect.

In general, the redshift of threshold results from various barrier lowering effects, such as image-force barrier lowering and electric field dependent tunneling. Under zero bias conditions, these two effects do not strongly affect the threshold as the $E_A$ value extracted from $R_0A$ nearly agrees with the designed threshold, and thus cannot account for the variation of the photoresponse threshold being observed. As shown in FIG. 11A, the detector structure contains a barrier offset of $\delta E_v = 10$ eV. The barrier offset ($\delta E_v$) gives rise to the VLWIR response. Holes injected from the higher barrier side (compared to the escape side) are capable of increasing the energy of holes in the absorber (emitter) 112, thus reducing the trapping and increasing the gain. In the presence of incident photons, the higher energetic holes will only need photons with less energy than Δ in order to escape over the barrier, comprising of the long-wavelength response. This two-step process is schematically shown in FIGS. 11A and 11C. The reduction in the threshold energy is thus determined by the amount of energy transferred, which in turn relies on the injection of hot holes.

Figure 13:
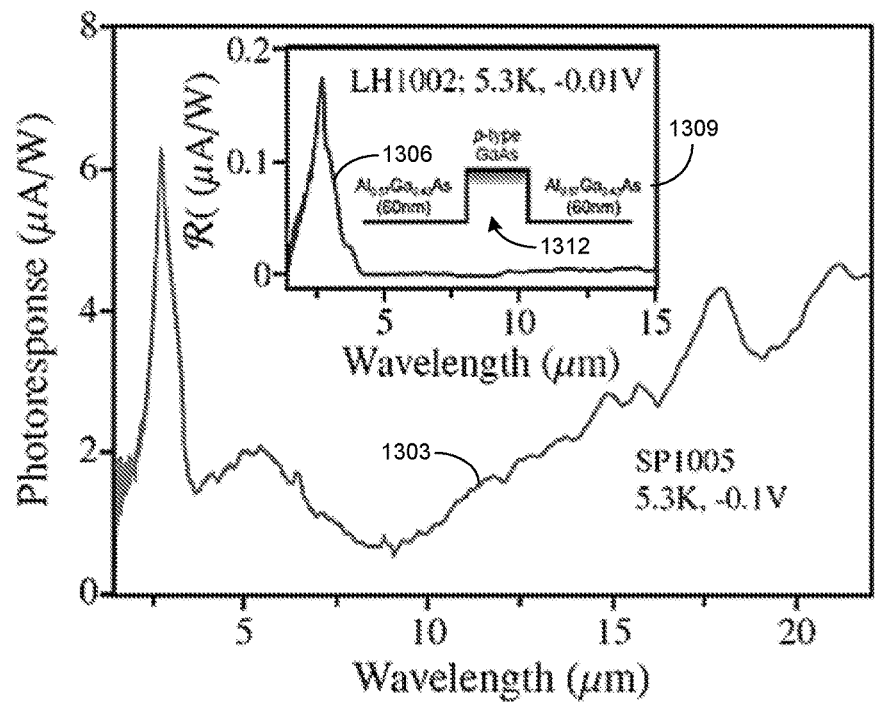
FIG. 13 includes plots of examples of photoresponse of detector samples in accordance with various embodiments of the present disclosure.

The effect of the barrier offset ($\delta E_v$) was experimentally verified by comparing the photoresponse of detectors with and without $\delta E_v$. FIG. 13 includes plots of the spectral response of two detector samples: SP1005 (curve 1303) and LH1002 (curve 1306 in inset panel 1309). Detector sample SP1005 has the same structure as sample SP1007 except for a 20 nm thickness of the absorber 112 as indicated in TABLE 1. The active region of detector sample LH1002 is shown in the inset panel 1309, where the p-type doped GaAs absorber 1312 ($p=1\times10^{19}$ cm$^{-3}$) is 18.8 nm thick. As can be seen, LH1002 has equal $Al_{0.57}Ga_{0.43}As$ barriers (60 nm thick) above and below the GaAs absorber 1312. Thus, $\delta E_v$ is 0.10 eV and 0 eV for SP1005 and LH1002, respectively. From FIG. 13, the VLWIR response of SP1005 has a profile similar to SP1007 (FIG. 4A), which indicates its independence of the absorber thickness. As expected, sample LH1002 does not show the VLWIR response at all. Bias voltages between −1V and 1V were carefully checked for a VLWIR response, which covers the entire electric filed range for measuring SP1005 and SP1007 where the VLWIR response occurs. Except for the gradual redshift of the response threshold with increasing bias (owing to barrier lowering), no response in the VLWIR range was observed. Thus, the role of the barrier offset ($\delta E_v$) in bringing up the VLWIR response was confirmed.

Figures 14A, 14B:
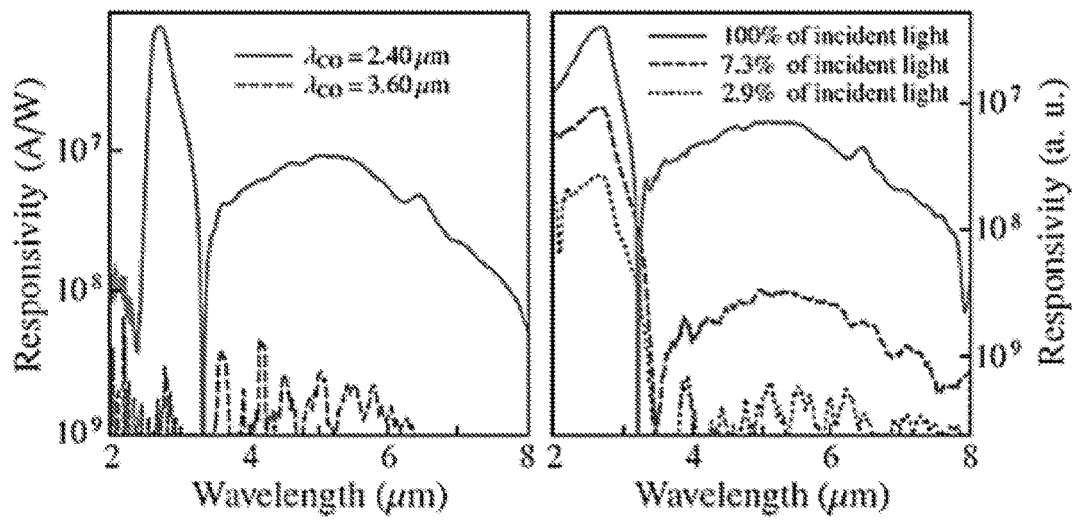
FIGS. 14A and 14B are plots of examples of photovoltaic response characteristics at different wavelengths and light intensities in accordance with various embodiments of the present disclosure.

To justify the proposed hot-hole mechanism, spectral response has been investigated by using different long-pass filters (with the cut-on wavelength of $\lambda_{CO}$) and different intensity of incoming light. This varies the energy or the number of hot holes injected into the absorber (emitter) 112. FIGS. 14A and 14B show the spectral responsivity. In FIG. 14A, the photovoltaic response characteristics are from measurements using different long-pass filters. $\lambda_{CO}$ is the cut-on wavelength. The filter with $\lambda_{CO}=3.60$ μm blocks the transport of hot holes overcoming the graded-barrier region, thus suppressing both the short and long-wavelength response. In FIG. 14B, the photovoltaic response are from measurements using different intensities of incident light, where 100% of light corresponds to the default optical aperture in the experiment. The invisible response beyond 4 μm obtained with 2.9% incoming light is due to an insufficient number of hot holes being injected.

Owing to the low dark-current operation, injected hot holes are primarily from photoexcited holes in the injector (BC) 106. By using a filter with $\lambda_{CO}=3.60$ μm, the short-wavelength response over range 1209 of FIGS. 12A and 12B should disappear, as the escape of photocarriers from the emitter to the injector (BC) 106 cannot be accomplished because of the missing of the hv>0.34 eV (λ<3.60 μm) photons. For the same reason, photoexcited holes in the injector (BC) 106 will be unable to overcome the $Al_{0.75}Ga_{0.25}As$ barrier to enter into the absorber (emitter) 112. The missing of hot holes injected thus suppresses the long-wavelength response as well in range 1212 of FIGS. 12A and 12B according to the aforementioned hot-carrier tuning mechanism. As shown in FIG. 14A, photovoltaic response was unseen throughout the entire spectral range. In contrast, the use of a filter with $\lambda_{CO}=2.40$ μm gives rise to both short- and long wavelength response owing to allowed emitter-to-injector and injector-to-emitter hot hole transport.

The results indicate the importance of hot hole injection. The efficiency of energy transfer between hot holes injected and cold holes in the emitter can be an important factor determining the long-wavelength response. Such energy transfer results from scattering events between hot and cold holes, and is subject to degradation due to the existence of events such as the hole-impurity scattering since the emitter is highly doped. Ideally, the photoresponse tuning should be enhanced by increasing the number of hot holes injected. As shown in FIG. 14B, the long-wavelength response is invisible when the light intensity is lowered to 2.9%, and quickly rises up when the incoming light increases to 7.3%, where 100% of light corresponds to the default optical aperture in the experiment. This may also explain the response characteristic of sample SP1001 not beyond 4 μm, where because of the flat barrier configuration the net injection of photoexcited holes from the injector 106 to absorber (emitter) 112 is negligible.

Higher activation energy of dark I-V characteristics than the photoresponse threshold can provide a significant improvement of the detector performance. According to $R_0A\sim\exp(-E_A/kT)$, the $R_0A$ value (at 80 K) of the detector with $E_A=0.40$ eV (capable of responding up to 8 μm) is nearly $10^{15}$ times higher than a detector (without tuning) with $E_A$ of 0.155 eV (corresponding the threshold wavelength of 8 μm). This means nearly $10^7$ improvement in D*. It is interesting to note that $E_A$ of sample SP1007 is correlated with the barrier of $Al_{0.75}Ga_{0.25}As$, but not $Al_{0.57}Ga_{0.43}As$ although it is present in the structure as well. To experimentally evaluate the D* improvement factor, same type of internal-photoemission detectors were compared, as shown in FIG. 12B (the photoconductive detector contained 30 periods of emitters and barriers), which is nearly $10^5$ times less than the tunable hot carrier detector.

The relatively low quantum efficiency (QE) associated with the low responsivity is partially due to the use of the highly doped single-emitter structure. This only gives about 2% absorption efficiency, and thus can be improved at least by a factor of 10 using multiple periods including an absorber and a barrier. The fast carrier relaxation time (about 0.1 ps) in $1\times10^{19}$ cm$^{-3}$ p-type doped GaAs is another reason for the low QE. An improvement by the factor of $10^4$-$10^8$ is possible by using a dots-in-well structure which has the carrier lifetime in the nanosecond range. Similar to the heterojunction case, hot-carrier effects in quantum dots can occur as a consequence of energy transfer between quantized states. The optimum operating condition may be in the vicinity of zero bias (photovoltaic) to suppress the dark current.

Figure 15A:
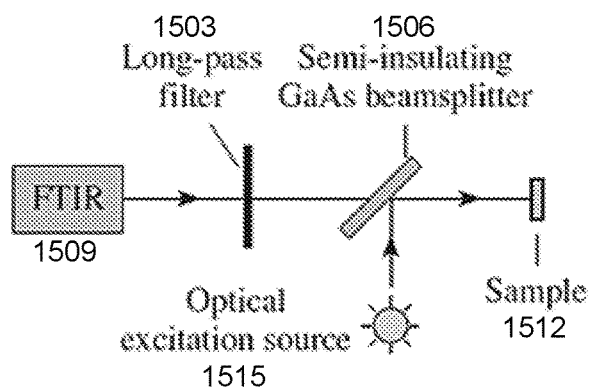
FIG. 15A is a schematic diagram illustrating an example of an experimental setup in accordance with various embodiments of the present disclosure.

As previously discussed, the proposed mechanism for the hot-hole response includes injecting hot holes to trigger the VLWIR response. The hole injection can be achieved through electrical and/or optical approaches. For the electrical approach, to obtain a non-trivial current passing through the graded barrier, the electric field is substantially higher than the corresponding bias at which hole distribution peaks are observed (e.g., at these values where the VLWIR response is disabled). An optimized solution can be achieved by separating the injection of hot holes and the collection of photoexcited holes by, e.g., altering the device scheme. In the case of the optical approach, the advantage is a convenient control of the hot-hole injection through varying the optical intensity. Referring to FIG. 15A, shown is a schematic diagram illustrating an example of an experimental setup 1500 for examining the optical approach. The setup includes a long-pass filter 1503 and a semi-insulating GaAs beamsplitter 1506, that was double-side polished and acted as a reflector. By selecting a suitable cut-on wavelength ($\lambda_{CO}$), the long-pass filter 1503 was used to allow or block high-energy photons from the FTIR spectrometer 1509 incident onto the sample 1512.

Figure 15B:
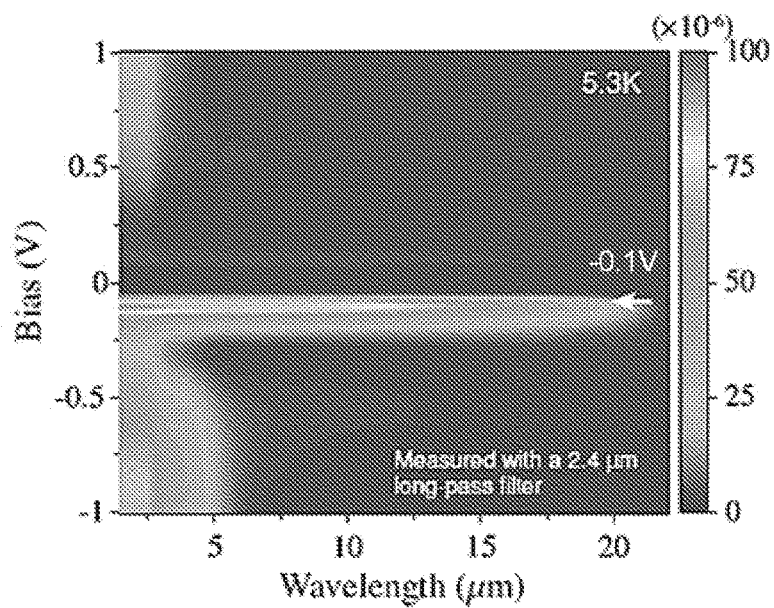
FIGS. 15B through 15D are plots of examples of the variation of spectral weight with respect to bias and wavelength in accordance with various embodiments of the present disclosure.
Figure 15C:
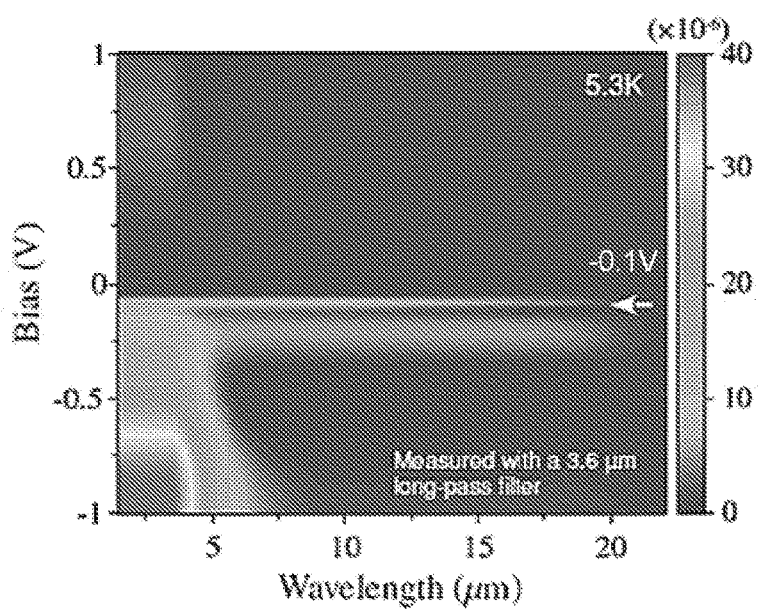
Figure 15D:
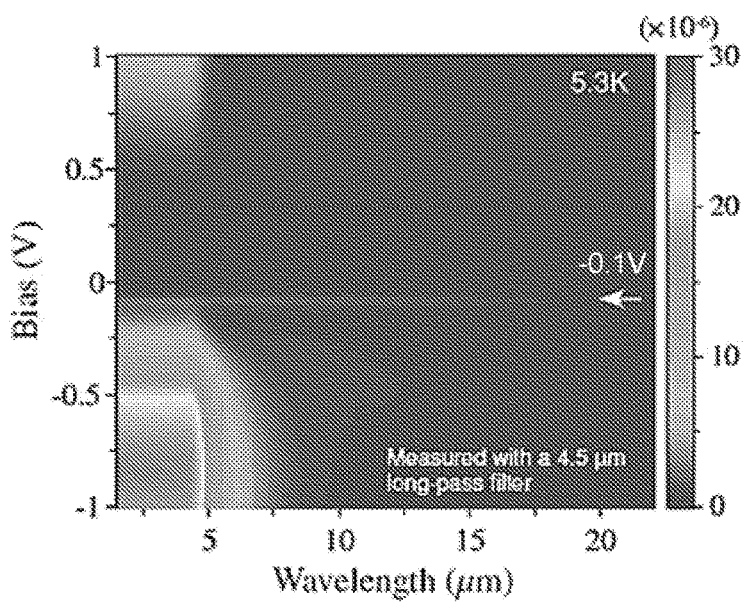
Figure 15E:
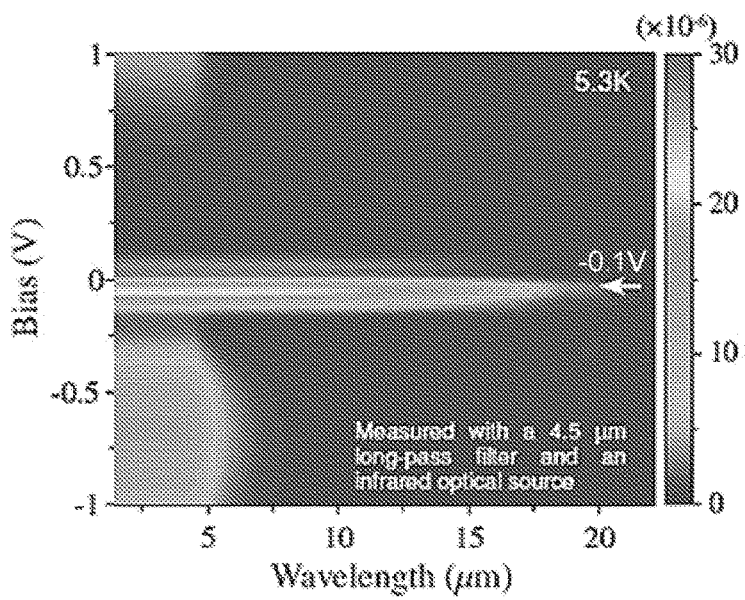
FIG. 15E is a plot of spectral weight illustrating an example of the recovery of the VLWIR response through the optical excitation in accordance with various embodiments of the present disclosure.

Referring to FIGS. 15B, 15C and 15D, shown are plots of spectral weights of response for sample SP1007 that were measured using long-pass filters 1503 with $\lambda_{CO}$ of 2.4 µm, 3.6 µm and 4.5 µm, respectively. The GaAs beamsplitter 1506 and optical excitation source 1515 are not used in this case. FIGS. 15B, 15C and 15D show the mappings of the SW. Increasing the $\lambda_{CO}$ corresponded to a reduction in the energies of the injected hot holes, thus mitigating the VLWIR response. The use of a $\lambda_{CO}$=4.5 µm fully suppresses the VLWIR response, which can barely be seen, because of the absence of hot holes in the absorber. However, the VLWIR response can be recovered by turning on the optical excitation source which induces hot holes being injected. This can be seen in FIG. 15E, which illustrated the recovery of the VLWIR response by providing hot holes through the optical excitation source 1515. These results are in good agreement with the hot-cold hole energy transfer mechanism.

Figure 16A:
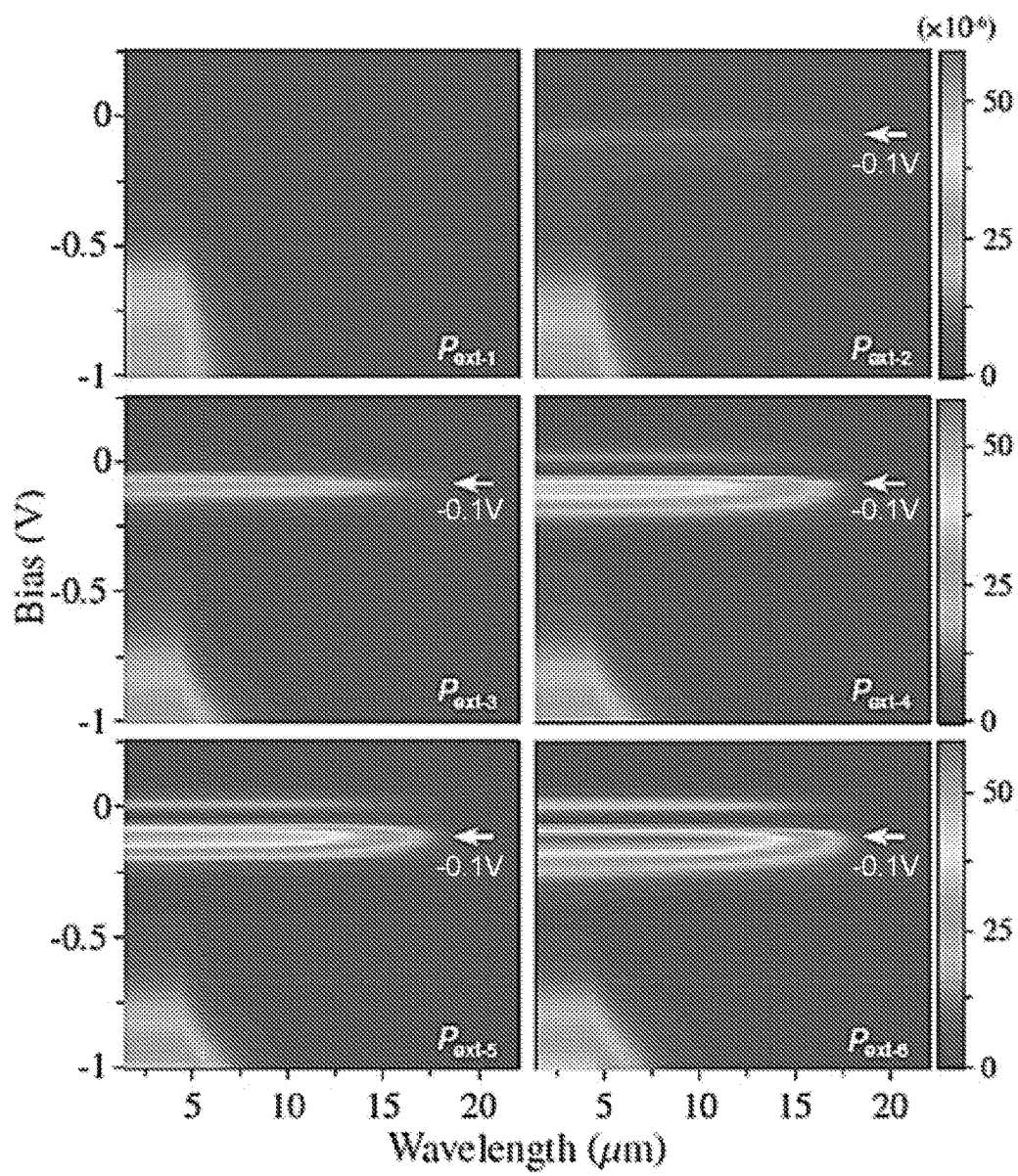
FIG. 16A are plots of examples of spectral weight with respect to various optical excitations in accordance with various embodiments of the present disclosure.
Figure 16B:
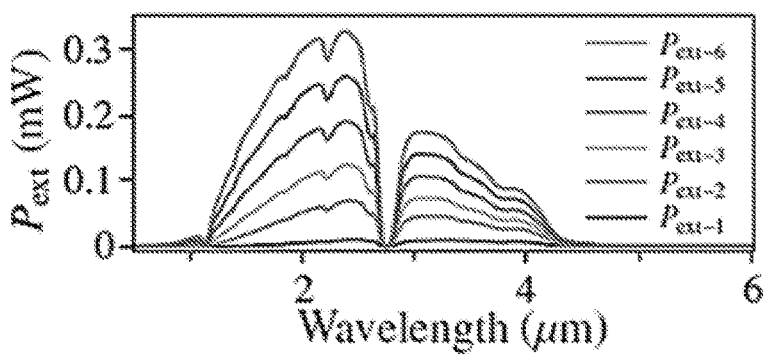
FIG. 16B is a plot of the power spectra of the various optical excitations of FIG. 16A in accordance with various embodiments of the present disclosure.
Figures 16C, 16D:
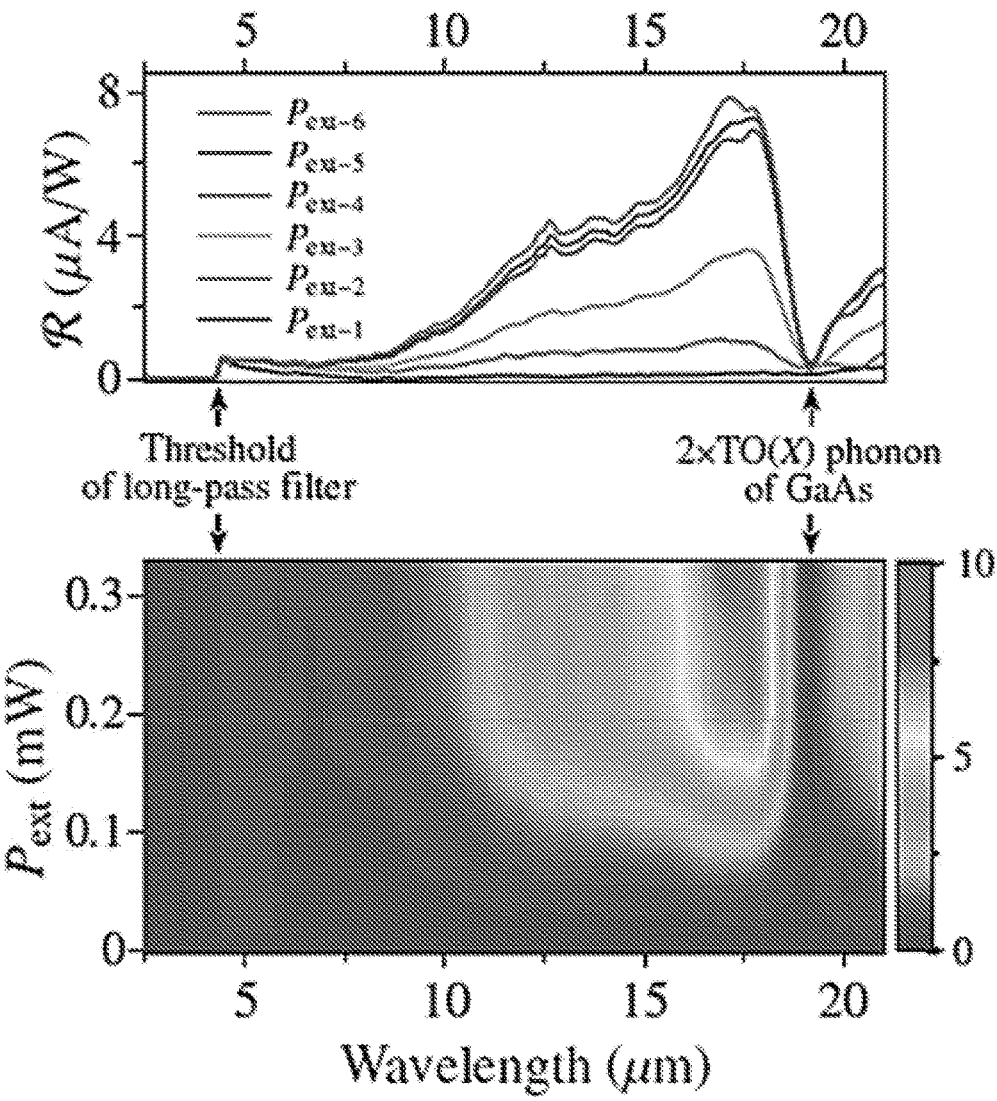
FIGS. 16C and 16D are plots illustrating the dependence of the VLWIR response on the excitation power in accordance with various embodiments of the present disclosure.

To show the tunability of the VLWIR response, detailed set of measurements were carried out using the optical excitation source 1515 of FIG. 15A. A $\lambda_{CO}$=4.5 µm long-pass filter 1503 was used throughout so that light from the FTIR spectrometer 1509 solely acts as a probe to detect the spectral response. The mappings of the SW at different excitation levels are shown in FIG. 16A, which includes plots of SW of response for sample SP1006 at the different excitation levels. SP1006 exhibited a VLWIR response that is very similar to the response of SP1007. FIG. 16B shows the excitation power spectra of the optical source 1515 (FIG. 15A) incident onto the sample 1512 (FIG. 15A) with an active area of 260×260 µm². A short-pass quartz glass filter was used to block the long-wavelength portion up to 4.8 µm. The variation of the VLWIR response (at −0.1V) with the excitation power was plotted in FIGS. 16C and 16D, which show the features associated with the cut-on wavelength of the filter and the 2×TO(X) phonons of the GaAs beamsplitter. These results demonstrate the dominant dependence of the VLWIR response on the excitation intensity.

By increasing the excitation, the energies of cold holes, and thus the threshold energy of the VLWIR response from 0.32 eV (the original value of cold holes) to 0 eV, may be tuned. However, such a characteristic was not identified experimentally. Very weak excitation which leads to a weak VLWIR response was also examined, but its threshold stayed nearly the same, Based upon this, it may be concluded that the dominant hot-cold hole interaction and the energy transfer process takes place through single hole-hole scattering events, rather than multiple scattering. As a consequence, cold holes are excited into states with nearly the same energies, despite how much the pump light is incident onto the sample. In this way, the process is independent of their original states and the absorber thickness. As seen in FIG. 8C, samples SP1005, SP1006 and 1007 display similar spectral shape. This also accounts for the variation of the strength of the VLWIR response with the excitation level, instead of with its threshold.

In view of the lack of VLWIR response in a symmetric flat-barrier sample (LH1002), the barrier offset between the two barriers (lying above and below the absorber) plays an important role in triggering the VLWIR response. Such an offset causes the energies of holes to be higher on the injection side compared to the collection side as illustrated in FIG. 7B. The threshold energy (0.012 eV) obtained from the escape-cone model simulation indicates that cold holes remain very close to the band edge of the barrier. This can be understood in terms of energy transfer through single hole-hole scattering. To obtain a response at the photon energy of 0.012 eV, the energy passed from a hot hole to a cold hole is about 0.27 eV (to excite a cold hole near the Fermi level), which is less than the total excess energy of the hot hole (about 0.38 eV relative to the Fermi level). This result allows the band filling effect to be excluded as a cause of the VLWIR response, as a large amount of holes would be needed to fill up energy states spanning an energy range of 0.27 eV, which is not possible under the experimental conditions. Also, since a higher capture probability is expected in the flat-barrier structure compared to the graded-barrier structure, the band filling effect was expected to lead to higher VLWIR response in sample LH1002, which is opposite to the observations. A small value of the threshold energy (e.g., 0.012 eV as simulated) can facilitate operation at a low bias and suppress the current component associated with hot holes. The hot-hole current increases with the bias and can overwhelm the VLWIR radiation caused photocurrent at higher biases.

The responsivity of the samples was on the order of 10 µA/W, which is relatively low when compared to other detectors. This may be attributed to the use of a single-emitter structure causing relatively low absorption. Also, the bulk semiconductor based absorber leads to a fast carrier lifetime (e.g., about 0.1 ps for p=1×10$^{19}$ cm$^{-3}$). By using structures such as quantum dots, increasing the lifetime by a factor of 10$^4$-10$^8$ is possible. Despite the low responsivity, an advantage of the results is the negligible dark current owing to the high activation energy (0.32 eV), even though a VLWIR response is obtained. This offers a possibility of including a long-wavelength response in a short-wavelength detector. In fact, the noise current is far below the experimental sensitivity (about 10-15 A/Hz$^{1/2}$). Using this limit, a conservative estimate of the specific detectivity is about 1×10$^9$ cm·Hz$^{1/2}$/W (using the highest responsivity of up to 69 µA/W), In addition to the 5.3K operation, the VLWIR response was measured up to 30K, showing the possibility of higher-temperature operation, Optimized structures based on our observations using quantum structures may lead to improvement in the responsivity, as well as the operating temperature.

The VLWIR response spectra 1603 for sample SP1007 at different temperatures (at −0.1V) are shown in FIG. 16E. As illustrated in the inset 1606, the responsivities at short- and long-wavelength (i.e., <4 µm and >4 µm, respectively) display the opposite temperature dependence (see inset). The VLWIR (>4 µm) response decreases with temperature and can be observed up to 30 K. At 35 K, the VLWIR response is flat, nearly at the spectral noise level. The dominant scattering varies with temperature. With increasing temperature, the carrier-carrier scattering can be mitigated by other processes such as carrier-ionized dopant scatterings. The reduction in the carrier-carrier scattering rate can decrease the efficiency of energy transfer from hot carriers to cold carriers. Consequently, the cold carriers are less likely to be excited which in turn decreases the VLWIR response. Another result is the increase in the concentration of cold holes at higher temperatures, which contributes to the <4 µm response. This explains the increase in the short-wavelength response with temperature. As can be seen from FIG. 16E, the sample only responds up to 4 µm for temperatures above 30 K. This is reasonable as it is a "normal" response (in accordance with $\lambda_c = hc/\Delta$). This short-wavelength response can be even observed at room temperature.

The use of an external optical excitation source 1515 (FIG. 15A) provided an optimized solution for realizing a VLWIR detector, for example, to integrate light-emitting diode (LED). The resultant device can be compact, and can be monolithically grown by traditional growth methods. As shown in FIG. 16F, the hot-carrier detector 1610 utilizes emission from a LED 1613 to initiate the injection of hot carriers and triggers the VLWIR response in the photodetector 1616, similar to the experimental results of FIGS. 16A-16D, In contrast to this, an up-converter 1620 uses the output of a photodetector 1623 upon absorbing infrared radiation drives a LED 1626 to emit visible light as shown in FIG. 16F.

Referring to FIG. 17, shown is an example of a multiple graded barrier structure based upon $GaAs/Al_xGa_{1-x}As$ materials. The detector may have two or more periods, which include an absorber 1712 and a barrier 1715 such as, e.g., a graded barrier. It is expected that, by increasing the periodic unit, enhancement of absorption by over a factor of 10 is expected compared to the demonstrated one-period detector. This accordingly leads to an increase in the quantum efficiency of the detector.

The demonstrated detectors use p-type GaAs as the absorber. However, the detector is not limited to this. Quantum structures such as quantum well/dot/ring and dots-in-quantum well can be used as the absorber (in place of the p-GaAs absorber as shown in the example of FIG. 17). By using quantum structure based absorber, significant improvement in the performance is expected, primarily as a result of improvement in the carrier lifetime. The fast carrier relaxation time (about 0.1 ps) in p-type doped GaAs is one of the reasons for the low quantum efficiency of the demonstrated detector. An improvement by the factor of $10^4$-$10^8$ is possible by using a dots-in-well structure which has the carrier lifetime in the nanosecond range.

Another option to optimize the performance is to change the barrier offset, i.e., the difference between the potential barriers above and below the p-GaAs absorber labeled as $\delta E_v$ in FIGS. 2 and 11A. $\delta E_v$ may also can be considered as the difference between $x_1$ and $x_2$ of FIG. 17. In the experiment, no tunable response in the FIR range can be observed when $x_1$ equals $x_2$. Hence, it appears that the offset ($\delta E_v$) is directly related to the detector response. This means that a structure with appropriate $x_1$ and $x_2$ being selected will lead to an optimum operating detector.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

TUNABLE HOT-CARRIER PHOTODETECTOR

APPENDIX

Detector characterizations. Prior to photoresponse characterization, the dark current-voltage-temperature (I-V-T) characteristic was evaluated. This allows determining the value of $\Delta$. The dark I-V-T characteristics were obtained by mounting the sample in a variable temperature cryostat, measured through a Keithley 2400 Source Meter and a computer controlled Keithley Switch System for selecting different mesas. For photoresponse measurements, samples were mounted in a liquid helium dewar, and measured by using a Perkin-Elmer system 2000 Fourier Transform InfraRed (FTIR) spectrometer, schematically shown in FIGS. A1 and A2 (below). FIG. A1 shows an experimental setup for photoresponse measurements. The short-wavelength portion of the FTIR light can be considered as the pump optical source which provides hot holes injected to the absorber of the detector, whereas the long-wavelength portion is to probe the VLWIR response.

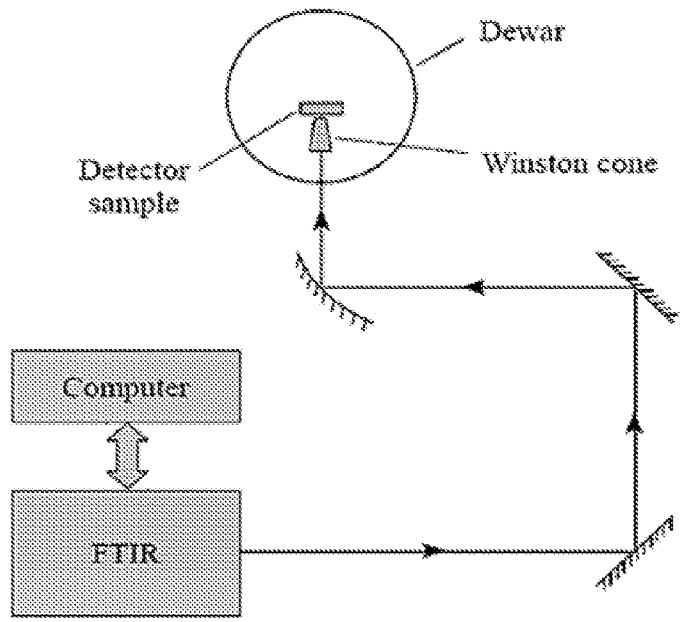

FIG. A1

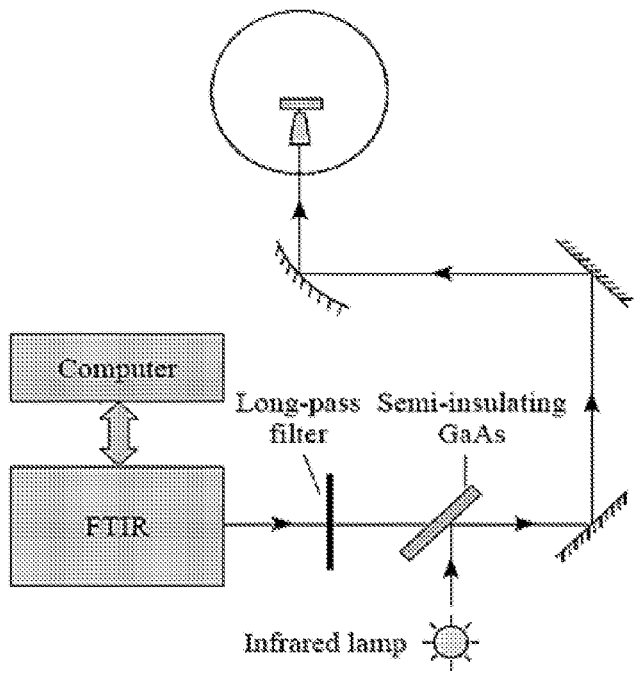

FIG. A2

FIG. A2 shows an experimental setup to separate the pump and probe optical sources. A long-pass filter is used to block the short-wavelength portion of the FTIR light. An external infrared lamp is used as a pump optical source. A semi-insulating double-side polished GaAs substrate acts as a reflector to guide the infrared light from the lamp into the detector sample. The sample acts a custom detector in place of the built-in detector of the spectrometer. The photovoltage signal from the sample upon light illumination is amplified by a low-noise preamplifier (Stanford Research Systems SR560) and then feeds into the spectrometer.

In the the experimental setup shown in FIG. A1 (above), the light of the FTIR spectrometer is guided into the dewar by plane and concave mirrors, and concentrated on the detector sample by a Winston cone, which is placed in front of the sample. The short-wavelength portion of the FTIR light (pump optical source) excites holes in the injector 106 (FIGS. 1A and 1B) of the detector, and thus provides photoexcited hot holes injected into the absorber 112 (FIGS. 1A and 1B). At the same time, the long-wavelength portion of the FTIR light is used to probe the photoresponse characteristic of the detector in the very long-wavelength infrared (VLWIR) range. Such a pump-probe measurement was also demonstrated by experiment which separates the pump and probe optical sources, as shown in FIG. A2 (above). A long-pass filter is inserted into the optical path to block the short-wavelength portion of the FTIR light. By using a semi-insulating double-side polished GaAs, acting as a reflector, infrared light from an infrared lamp is mixed with the FTIR light (the long-wavelength portion) and hit on the detector sample. FIG. A3 shows the power spectrum of the infrared lamp.

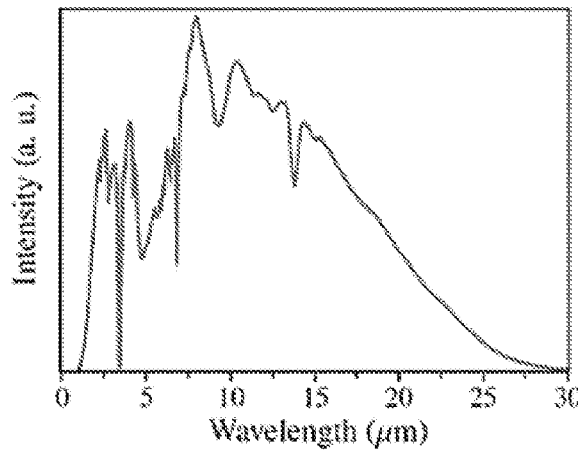

FIG. A3

The infrared light provides high-energy photons, thus acting as a pump optical source. The GaAs substrate is mostly transparent to the FTIR light except for the phonon absorption region (> 18μm). The identification of the VLWIR response using an external infrared lamp as the optical pump source of FIG. A2 also demonstrates a solution to realize a more practical hot-carrier photodetector, e.g., a detector which integrates a light-emitting diode (LED). The LED is designed to emit infrared radiation, and thus used to tailor the VLWIR response.

To calibrate the spectral responsivity, a Si composite bolometer, which has a flat sensitivity over the entire wavelength range, is measured. The sample and bolometer spectra (bolometer was mounted in the same dewar) were obtained with an identical optical path using the same optical components in the same setup. The spectral responsivity of the detector is obtained by dividing the intensity signal of the detector spectrum ($\mathcal{I}_d$) from the detector sample by the intensity signal of the bolometer spectrum ($\mathcal{I}_b$), i.e., $\mathcal{R} = C \cdot [\mathcal{I}_d / \mathcal{I}_b]$, where $C$ is a calibrating factor independent of wavelength, which takes into account the sensitivity of bolometer, differences between measuring the detector and bolometer (including the geometrical difference and the gain of the preamplifier), and the resistances of the detector and load resistor. The load resistor is used as a voltage divider, with a fixed resistance of $7 \times 10^7$ Ohm for all of the measurements.

The spectral range of photoresponse covers a broad wavelength range from 1.5μm to 55μm, which consists of two working ranges of the beam splitters for the FTIR spectrometer. A KBr and 6μm Mylar beam splitters were used to measure the wavelength ranges of 1.5μm – 23μm and 23μm – 55μm, respectively.

Confirming the VLWIR response. Considering that the photoresponse threshold of previous internal-photoemission heterojunction detectors agrees very well with the detection limit of the detector determined by $\lambda_c = hc/\Delta$, observing response beyond 4μm in the present detector with a relative large value of $\Delta$ (0.32eV) is uncommon and unexpected. Therefore, it was confirmed that the observed VLWIR response was not a result of experimental artifacts. In the disclosure, a few evidences have been presented which verify the VLWIR response. These include (1) the escape-cone model simulation, (2) measuring hole distribution peaks at applied biases where VLWIR response rises, and (3) tunable VLWIR response through varying the pump optical source (using filters/an infrared lamp). In addition to these, measurement using an external infrared lamp as the optical pump source further [experimental setup of FIG. A2] proves the VLWIR response being observed. The spectral response is plotted in FIG. A4.

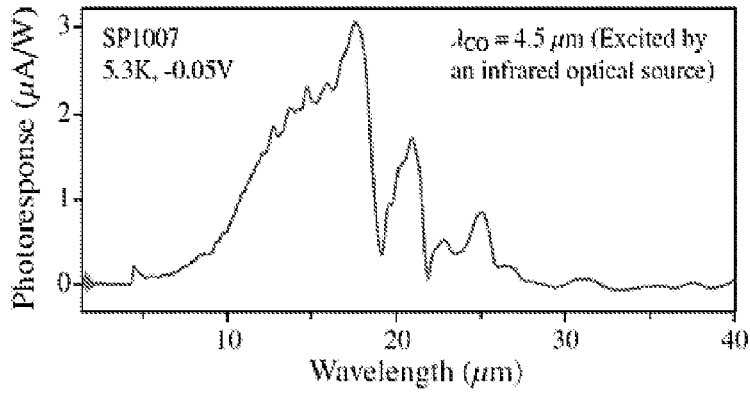

FIG. A4

FIG. A4 shows a photoresponse of sample SP1007 measured using the experimental setup of FIG. A2, in which the cut-on wavelength ($\lambda_{CO}$) of the long-pass filter is 4.5μm. FIG. 4A shows a few dips in the >15μm wavelength range, which can be seen by comparing with the transmission spectrum of GaAs, due to multiple phonon absorption of GaAs. FIG. A4 shows a transmission spectrum of the semi-insulating double-side polished GaAs substrate (incident angle is 45°). It is understandable that, since the GaAs substrate lies in the optical path the FTIR light, its absorbing features will show on the detector response spectrum. This confirms that the response signal in the VLWIR range results from the FTIR light, but not an artifact of the FTIR system.

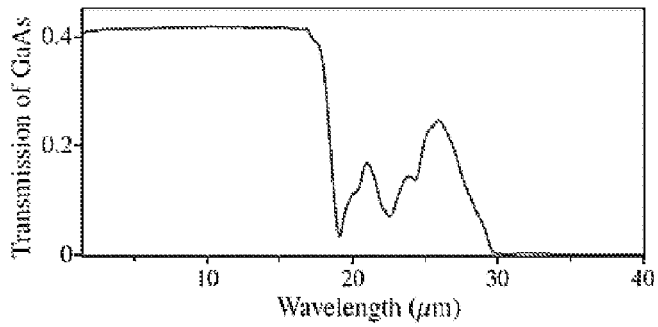

FIG. A5

Bias-dependent VLWIR response. Representative response spectra at different applied biases are shown in FIGS. A6 and A7. FIG. A6 shows an example of the bias-dependent photoresponse of sample SP1007. The general spectral profile between 5μm – 50μm agrees with the escape-cone model. Two sharp peaks at about 25.3μm and about 35.6μm (or 395cm$^{-1}$ and 281cm$^{-1}$ in wavenumber) were observed that disagree with the model at higher negative bias (up to −0.3 V). The 25.3μm peak becomes strong for bias greater than −0.06 V, and the 35.6μm peak rises when the bias is greater than −0.08 V. In the very long-wavelength range, the absorption of the absorber is dominated by the intra-band free-carrier transition and phonon absorption. When the plasmon frequency is comparable to the longitudinal optical (LO) phonon frequency, strong coupling between the plasmon and LO modes is expected, giving rise to two coupling modes.

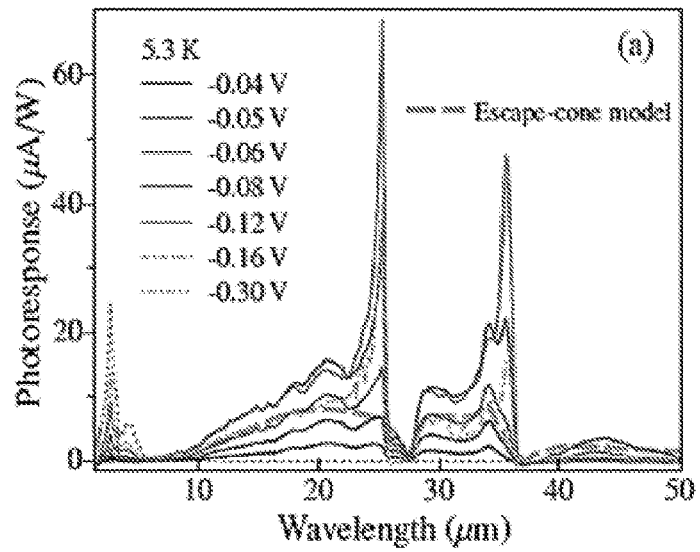

FIG. A6

FIG. A7 shows a plot of the calculated pasmon-phonon coupling modes ($\omega_+$ and $\omega_-$). The calculation takes into account the damping effect which affects the modes compared to that without damping. It was found that the two sharp response peaks in FIG. A6 are close to $\omega_+$ and $\omega_-$ at $p=1\times10^{19}$cm$^{-3}$ (where p is the doping concentration of the p-type GaAs absorber), which are 430cm$^{-1}$ (or 23μm) and 236cm$^{-1}$ (or 42μm), respectively. The coupling modes were calculated based on equilibrium distribution without the hot-hole effect. Upon the injection of hot holes, part of the cold holes acquired energies from the hot holes and were excited into higher energy states. In terms of the experimental conditions, the total concentration of holes in the absorber could be close to the original doping concentration (i.e., $1\times10^{19}$cm$^{-3}$). However, the distribution may be much different from that without hot-hole injection. This means that the calculation shown in FIG. A7 may not be an actual representation of the coupling. In spite of the hot-hole effect, comparison between the two sharp response peaks and the coupling modes implies the important role of the phonon-plasmon coupling in affecting the response. Despite this, the observed VLWIR response was experimentally confirmed, and its broad spectral profile is in agreement with the prediction of the escape-cone model.

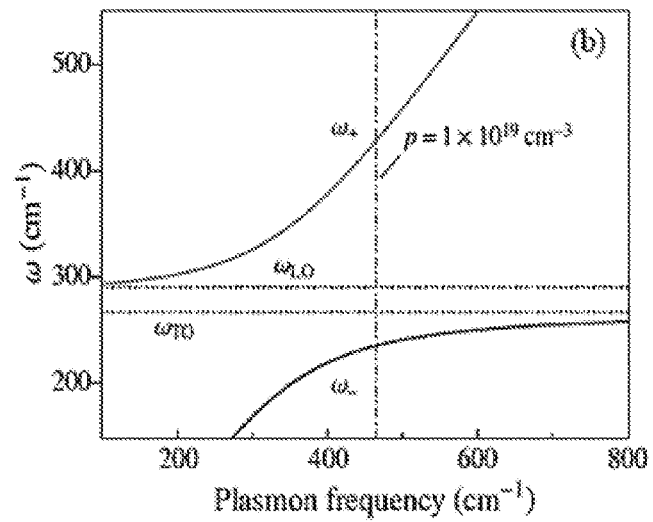

FIG. A7

Photoresponse of the symmetrical flat-barrier detector. The barrier offset ($\delta E_v$; FIG. 11A) is needed to obtain the VLWIR response. This was experimentally verified by comparing the photoresponse of samples with $\delta E_v$ (SP1005, SP1006 and SP1007) and without $\delta E_v$ (LH1002), as shown in FIG. 4B. The values of $\delta E_v$ were 0.10eV and 0eV for SP1005–1007 and LH1002, respectively. The VLWIR responses of the three samples SP1005–1007 have similar spectral profiles. As expected, sample LH1002 does not show the VLWIR response at all. Different bias voltages between -1V and 1V were carefully checked, which covers the entire electric filed range for measuring SP1005–1007 where the VLWIR response occurs. Except for the gradual redshift of the response threshold with increasing bias (owing to barrier lowering), no response in the VLWIR range was observed.

FIG. A8 shows differential photocurrents ($dI_{ph}/dF$) of the symmetrical flat-barrier sample LH1002, measured using different optical excitation sources. It should be noted that high-energy hot holes injected into the absorber can be obtained for sample LH1002 by applying a higher bias. This may increase the hot-cold hole interactions and lead to hole distribution peaks being observed. However, as shown in FIG. A8, only a differentiated photocurrent peak at 0V was observed, which may not be a result of hot-cold hole interactions by comparing with differential photocurrents of SP1007 and hot-carrier spectroscopy. In hot-carrier spectroscopy, a carrier distribution peak is typically observed when the potential barrier in the injection side is higher than that in the collection side, which differs from the operation of LH1002.

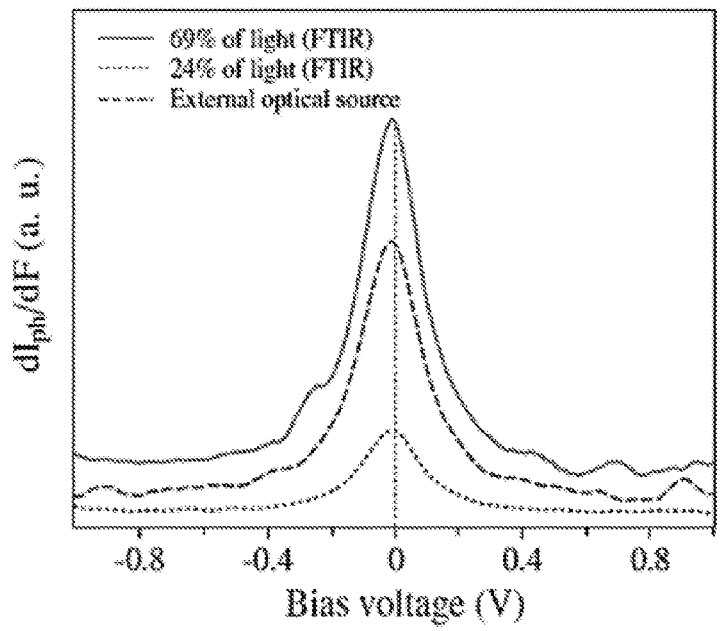

FIG. A8

Therefore, at least the following is claimed:

1. A hot-carrier photodetector, comprising:
a graded barrier having a composition that linearly varies over a thickness of the graded barrier from top to bottom;
an absorber disposed on the graded barrier; and
a second barrier disposed on the absorber opposite the graded barrier, where a barrier offset ($\delta E_v$) is provided between a higher barrier height of the graded barrier and a lower barrier height of the second barrier on opposite sides of the absorber, and hot holes injected into the absorber over the higher barrier height of the graded barrier excite cold holes in the absorber to higher energy states thereby extending a photoresponse of the hot-carrier photodetector.

2. The hot-carrier photodetector of claim 1, wherein the absorber comprises p-type doped GaAs.

3. The hot-carrier photodetector of claim 1, wherein the graded barrier is disposed between the absorber and an injector.

4. The hot-carrier photodetector of claim 3, wherein the injector comprises p-type doped GaAs.

5. The hot-carrier photodetector of claim 1, wherein the second barrier is disposed between the absorber and a collector.

6. The hot-carrier photodetector of claim 5, wherein the collector comprises p-type doped GaAs.

7. The hot-carrier photodetector of claim 1, wherein the second barrier is a constant barrier.

8. The hot-carrier photodetector of claim 7, wherein the constant barrier comprises $Al_xGa_{1-x}As$, where $0 < x < 1$.

9. The hot-carrier photodetector of claim 1, wherein the second barrier is a graded barrier.

10. The hot-carrier photodetector of claim 9, wherein the graded barrier comprises $Al_xGa_{1-x}As$, where x varies from x2 to x1, where $0 < x1 < x2 < 1$.

11. The hot-carrier photodetector of claim 1, wherein the graded barrier comprises $Al_xGa_{1-x}As$, where x varies from x2 to x1, where $0 < x1 < x2 < 1$.

12. The hot-carrier photodetector of claim 1, wherein the hot-carrier photodetector is reverse biased.

13. The hot-carrier photodetector of claim 1, further comprising:
a second absorber disposed on the second barrier; and
a third barrier disposed on the second absorber.

14. The hot-carrier photodetector of claim 13, wherein the third barrier is a graded barrier.

15. The hot-carrier photodetector of claim 13, wherein the third barrier is disposed between the second absorber and a collector.

16. The hot-carrier photodetector of claim 1, wherein the second barrier is disposed between the absorber and a third absorber.

17. The hot-carrier photodetector of claim 1, wherein extension of the photoresponse is based upon a reverse bias applied to the hot-carrier photodetector.

18. The hot-carrier photodetector of claim 17, wherein increasing the reverse bias increases the hot holes injected into the absorber.

19. The hot-carrier photodetector of claim 1, wherein the cold holes in the absorber that are excited to the higher energy states are responsive to very long-wavelength infrared (VLWIR) radiation.

20. The hot-carrier photodetector of claim 1, wherein the photoresponse of the hot-carrier photodetector is extended beyond a wavelength limit ($\lambda_c$) of the hot-carrier photodetector.

* * * * *